(12) United States Patent
Onishi et al.

(10) Patent No.: US 7,372,111 B2
(45) Date of Patent: May 13, 2008

(54) SEMICONDUCTOR DEVICE WITH IMPROVED BREAKDOWN VOLTAGE AND HIGH CURRENT CAPACITY

(75) Inventors: Yasuhiko Onishi, Nagano (JP); Takeyoshi Nishimura, Nagano (JP); Yasushi Niimura, Nagano (JP); Masanori Inoue, Nagano (JP)

(73) Assignee: Fuji Electric Device Technology Co., Ltd. (JP)

( * ) Notice: Subject to any disclaimer, the term of this patent is extended or adjusted under 35 U.S.C. 154(b) by 462 days.

(21) Appl. No.: 11/197,751

(22) Filed: Aug. 4, 2005

(65) Prior Publication Data

US 2006/0033153 A1    Feb. 16, 2006

(30) Foreign Application Priority Data

Aug. 4, 2004   (JP)  .............................. 2004-228599
Jan. 13, 2005  (JP)  .............................. 2005-006869

(51) Int. Cl.
    *H01L 29/72*   (2006.01)
(52) U.S. Cl. ...................... 257/401; 257/328; 257/329; 257/266; 257/341; 257/342; 257/339; 257/490; 257/493
(58) Field of Classification Search ................ 257/266, 257/329, 328, 341, 339, 342, 401, 490
    See application file for complete search history.

(56) References Cited

U.S. PATENT DOCUMENTS 5,216,275 A    6/1993  Chen
5,438,215 A    8/1995  Tihanyi
6,097,063 A    8/2000  Fujihira
6,674,126 B2   1/2004  Iwamoto et al.
6,677,626 B1   1/2004  Shindou et al.
6,696,728 B2   2/2004  Onishi et al.
6,700,141 B2   3/2004  Iwamoto et al.
6,724,042 B2 * 4/2004  Onishi et al. ............... 257/341

FOREIGN PATENT DOCUMENTS

| JP | 2003-224273    | 8/2003 |
| JP | 2003-273355 A  | 9/2003 |
| JP | 2004-22716 A   | 1/2004 |
| JP | 2004-72068 A   | 3/2004 |

* cited by examiner

*Primary Examiner*—Edward Wojciechowicz
(74) *Attorney, Agent, or Firm*—Rossi, Kimms & McDowell LLP

(57) ABSTRACT

The superjunction semiconductor device includes a drain drift section, which includes a first alternating conductivity type layer formed of first n-type regions and first p-type regions arranged alternately. The device also includes a peripheral section around the drain drift section, which includes a second alternating conductivity type layer formed of second n-type regions and second p-type regions arranged alternately. The peripheral section further includes a third alternating conductivity type layer in its surface portion. The third alternating conductivity type layer is formed of third n-type regions and third p-type regions arranged alternately. At least the peripheral section is configured to improve the avalanche withstanding capability over the entire device.

32 Claims, 28 Drawing Sheets

SEMICONDUCTOR DEVICE WITH IMPROVED BREAKDOWN VOLTAGE AND HIGH CURRENT CAPACITY

BACKGROUND

Generally, semiconductor devices can be classified into a lateral semiconductor device, where its electrodes are formed on one major surface of the device, and a vertical semiconductor device, where its electrodes are distributed onto both of its major surfaces facing opposite to each other. In the vertical semiconductor device, the direction of the drift current flow in its ON-state coincides with the direction of the expansion of the depletion layer caused by a reverse bias voltage in its OFF-state. In the typical planar-type n-channel vertical MOSFET, its high resistive portion formed of an $n^-$-type drift layer works as a region in which the drift current is made to flow substantially vertically in the ON-state of the MOSFET. Since the drift resistance is reduced by shortening the current path in the $n^-$-type drift layer, the on-resistance of the planar-type n-channel vertical MOSFET is reduced.

The high resistive portion is depleted in the OFF-state to raise the breakdown voltage of the MOSFET. As the $n^-$-type drift layer is thinner, the width of the depletion layer expanding from the pn-junction between a p-type base region and an $n^-$-type drift layer becomes narrower. Accordingly, the electric field strength reaches the critical electric field strength of silicon sooner, lowering the breakdown voltage. In contrast, the $n^-$-type drift layer needs to be thick in the semiconductor device exhibiting a high breakdown voltage to increase the on-resistance thereof, resulting in large loses. Thus, there exists a tradeoff relation between the on-resistance and the breakdown voltage.

It is well known that the tradeoff relation between the on-resistance and the breakdown voltage exists also in the IGBTs, bipolar transistors, diodes, and similar semiconductor devices. The tradeoff relation between the on-resistance and the breakdown voltage exists also in the lateral semiconductor devices, where the direction of the drift current flow in its ON-state does not coincide with the direction of the expansion of the depletion layer caused by a reverse bias voltage in its OFF-state.

Superjunction semiconductor devices, which include an alternating conductivity type drift layer formed of heavily doped n-type drift regions and heavily doped p-type partition regions arranged alternately, are known to be effective for reducing the tradeoff relation. See for instance U.S. Pat. Nos. 5,216,275 and 5,438,215, and Japanese patent publication JP PHei. 9(1997)-266311A. Even when the alternating conductivity type drift layer is doped heavily, the semiconductor device having the structure described above obtains a high breakdown voltage, as the depletion layers expand laterally from the pn-junctions extending vertically, to the direction of the alternate arrangement of the constituent regions, depleting the entire drift layer.

For realizing a semiconductor device exhibiting a high breakdown voltage, it is necessary to provide the semiconductor device with a peripheral structure. If the semiconductor device is not provided with any peripheral structure, it will be difficult to realize a high breakdown voltage, since the breakdown voltage is low in the peripheral portions of the semiconductor device. For obviating the problems described above, it has been proposed to arrange an alternating conductivity type layer in the surface portion of the peripheral section around the alternating conductivity type layer in the active section of the device. The alternating conductivity type layer in the peripheral section is formed of n-type regions and p-type regions arranged alternately at a pitch that is narrower than the pitch of the n-type regions and p-type regions arranged alternately in the alternating conductivity type layer in the active section. See for instance Japanese patent publications JP P2003-224273A and JP P2004-22716A. The proposed structure relaxes the surface electric field near the active section of device to maintain a high breakdown voltage.

For improving the avalanche withstanding capability of the drift layer in the superjunction semiconductor device, a structure that improves the negative resistance formed during the avalanche breakdown has been proposed. See for instance Japanese patent publication JP P2004-72068A. Moreover, a structure that includes an $n^-$-type drift layer between a layer with a low electrical resistance and an alternating conductivity type layer is known. The $n^-$-type drift layer is doped more lightly than the n-type drift regions in the alternating conductivity type layer. See for instance Japanese patent publication JP P2003-273355A.

FIGS. 23-25 illustrate a conventional vertical MOSFET. FIG. 23 shows a quarter of the drain drift section (the active section of the device). Here, the vertical MOSFET includes an $n^+$-type drain layer (contact layer) 11 having low electrical resistance on the lower surface side of the semiconductor chip. A drain electrode 18 is in electrical contact with the $n^+$-type drain layer 11. A vertical drain drift section 22, which includes a first alternating conductivity type layer 22a, 22b, is on the $n^+$-type drain layer 11. Heavily doped p-type base regions (p-type wells) 13a working as an active section of the device are formed selectively in the surface portion of the vertical drain drift section 22. A heavily doped $n^+$-type source region 14 is formed selectively in the surface portion of the p-type base region 13a. A gate electrode layer 16 made of polysilicon is above the semiconductor chip with a gate insulator film 15 interposed between the gate electrode layer 16 and the semiconductor chip. A source electrode 17 in electrical contact commonly with the p-type base regions 13a and the $n^+$-type source regions 14 via contact holes bored through an interlayer insulator film 19a is formed above the chip. The $n^+$-type source region 14 is formed shallowly in the p-type base region 13a shaped as a well such that a double-diffusion-type MOS section is formed. A $p^+$-type contact region 26 is in the p-type base region 13a. Although not illustrated, a metal film gate wiring is in electrical contact with gate electrode layer 16.

The vertical drain drift section 22 coincides almost with the portion of the semiconductor chip beneath a plurality of p-type base regions 13a working as the active section. The vertical drain drift section 22 includes the first alternating conductivity type layer formed first n-type regions 22a and first p-type regions 22b arranged alternately at a pitch P1 repeating along the major surfaces of the semiconductor chip such that the first n-type regions 22a and the first p-type regions 22b extend parallel to each other along the thickness direction of the semiconductor chip. The upper ends of some first n-type regions 22a reach sandwiched regions 12e, which is above the region between the p-type base regions 13a and the lower ends of the first n-type regions 22a contacting the $n^+$-type drain layer 11. The first n-type regions 22a reaching the sandwiched regions 12e work as current path regions in the ON-state of the MOSFET. The other first n-type regions 22a do not quite work as current path regions. The first p-type regions 22b contact the well bottoms of the p-type base regions 13a at the upper ends thereof and with the $n^+$-type drain layer 11 at the lower ends thereof.

A peripheral section 30 around the drain drift section 22 includes a second alternating conductivity type layer 30a, 30b continuous with the first alternating conductivity type layer in drain drift section 22. The second alternating conductivity type layer is formed of second n-type regions 30a and second p-type regions 30b arranged alternately at a pitch P1 repeating along the major surfaces of the semiconductor chip such that the second n-type regions 30a and the second p-type regions 30b extend parallel to each other along the thickness direction of the semiconductor chip. The pitches of the first and second alternating conductivity type layers are substantially the same. The impurity concentrations of the first and second alternating conductivity type layers also are substantially the same.

A third alternating conductivity type layer is formed in the surface portion of the peripheral section 30. The third alternating conductivity type layer is formed of third n-type regions 34a and third p-type regions 34b arranged alternately at a pitch P2 repeating along the upper surface of the semiconductor chip such that the third n-type regions 34a and the third p-type regions 34b also extend parallel to each other along the thickness direction of the semiconductor chip. The impurity concentrations in the third alternating conductivity type layer are lower than the impurity concentrations in the second alternating conductivity type. The pitch P2 is narrower than the pitch P1.

An oxide film (insulator film) 33 is on the third alternating conductivity type layer. The oxide film 33 becomes thicker stepwisely from the drain drift section 22 to the peripheral section 30 and covers the third alternating conductivity type layer. A field plate electrode FP extends from the source electrode 17 onto the oxide film 33. An n-type channel stopper region 50 in contact with the n$^+$-type drain layer 11 is formed around the peripheral section 30. A stopper electrode 51 is on the n-type channel stopper region 50. The stopper electrode 51 is in electrical contact with the n-type channel stopper region 50.

Although the previously mentioned Japanese patent publication JP 2003-224273A discloses the techniques for obtaining a low on-resistance and a high breakdown voltage, it does not describe anything on the avalanche withstanding capability (breakdown current). The previously mentioned Japanese patent publication JP 2004-72068A does not disclose any structure for improving the negative resistance formed during the avalanche breakdown even if the peripheral section of the device is disclosed. Even when the avalanche withstanding capability in the active section of the device is improved, it will be difficult to secure and guarantee the avalanche withstanding capability of the entire device, if the avalanche withstanding capability in the peripheral section of the device is not improved.

The present inventors have conducted simulations on the current vs. voltage characteristics of the peripheral and active sections in the avalanche breakdown of a vertical MOSFET of the 600 V class having the structure shown in FIGS. 23-25. The sizes and the impurity concentrations of the constituent portions of the alternating conductivity type layers used for the simulations are as follows. The thickness (in the depth direction) of the drain drift section 22 is 44.0 μm. The first n-type region 22a and the first p-type region 22b each are 8.0 μm in width so that the pitch P1 becomes 16.0 μm. The impurity concentration in the first n-type region 22a and the first p-type region 22b is $2.4\times10^{15}$ cm$^{-3}$. The thickness (in the depth direction) of the second alternating conductivity type layer in the peripheral section 30 is 31.0 μm. The second n-type region 30a and the second p-type region 30b each are 8.0 μm in width so that the pitch P1 at the second alternating conductivity type layer remains at 16.0 μm. The impurity concentration in the second n-type region 30a and the second p-type region 30b is $2.4\times10^{15}$ cm$^{-3}$. The thickness (in the depth direction) of the third alternating conductivity type layer in the peripheral section 30 is 13.0 μm. The third n-type region 34a and the third p-type region 34b each are 4.0 μm in width so that the pitch becomes 8.0 μm. The impurity concentration in the third n-type region 34a and the third p-type region 34b is $4.8\times10^{14}$ cm$^{-3}$.

FIGS. 26-28 are graphs describing the simulation results in the portion along the line segment XXIV-XXIV of FIG. 23. Considering the impurity concentration variations, the impurity concentration Nn in the n-type regions is set to be lower by 10% than the impurity concentration Np in the p-type regions in FIG. 26, the impurity concentration Nn in the n-type regions is set to be equal to the impurity concentration Np in the p-type regions in FIG. 27, and the impurity concentration Nn in the n-type regions is set to be higher by 10% than the impurity concentration Np in the p-type regions in FIG. 28. FIGS. 26-28 indicate that there exists a negative resistance region in the current vs. voltage characteristics of the peripheral section of the device for all the impurity concentration relations simulated.

Since a positive feedback is formed in the direction to which the current is made to flow in the negative resistance region, current localization is formed, further causing breakdown of the device. Therefore, the current that can be made to flow in the active section before the active section is broken down (the avalanche withstanding capability) is limited by the avalanche voltage (the voltage between the drain and the source), at which negative resistance is formed in the peripheral section. Considering the impurity amount variations, the avalanche withstanding capability of the device having the conventional structure is around 50 A/cm$^2$. See FIG. 28. Therefore, for improving the avalanche withstanding capability within a predetermined impurity amount variation range, it is necessary to improve the avalanche voltage, at which negative resistance is formed in the peripheral section of the device, so that the avalanche voltage in the peripheral section can be equal to or higher than the avalanche voltage in the active section. Alternatively, it is necessary to relax the negative resistance characteristics so that positive resistance characteristics can be obtained.

There remains a need for a semiconductor device without the problems associated with the conventional superjunction semiconductor device. The present invention addresses this need.

SUMMARY OF THE INVENTION

The present invention relates to a vertical power semiconductor device that can form insulated gate field effect transistors (MOSFETs), insulated gate bipolar transistors (IGBTs), bipolar transistors, and such active devices, and diodes and such passive devices.

Such a semiconductor device can include a semiconductor chip having a first major surface and a second major surface facing opposite to each other, an active section on the side of the first major surface for flowing current actively or passively, and a low resistance layer of a first conductivity type on the side of the second major surface, the low resistance layer exhibiting low electrical resistance. A vertical drift section is between the active section and the low resistance layer. The vertical drift section provides a substantially vertical drift current path in the ON-state of the semiconductor device and the vertical drift section becomes substantially depleted in the OFF-state of the semiconductor device. The vertical drift section comprises a first alternating conductivity type layer composed of first regions of the first conductivity type and first regions of the second conductivity type arranged alternately at a first pitch repeating along the first major surface.

A peripheral section can be formed between the first major surface and the low resistance layer, and formed around the vertical drift section. The peripheral section provides substantially no current path in the ON-state of the semiconductor device and becomes substantially depleted in the OFF-state of the semiconductor device. The peripheral section can include a first subsection and a second subsection.

The first subsection can include a second alternating conductivity type layer comprised of second regions of the first conductivity type and second regions of the second conductivity type arranged alternately at the first pitch also repeating along the first major surface.

The second subsection can be in the surface portion of the peripheral section between the first major surface and the first subsection. The second subsection can include a third alternating conductivity type layer composed of third regions of the first conductivity type and third regions of the second conductivity type arranged alternately at a second pitch also repeating along the first major surface. The second pitch can be narrower than the first pitch. The width of the third regions of the second conductivity type can be wider than the width of the third regions of the first conductivity type.

Alternatively, the second subsection can comprise a region of the second conductivity type having a width wider than the first pitch, and the second subsection can be doped more lightly than the second regions of the second conductivity. The second subsection can include an impurity of the first conductivity type and an impurity of the second conductivity type.

The impurity concentration, the carrier concentration, or the carrier amount in the third regions of the second conductivity type can be higher than the respective impurity concentration, the carrier concentration, or the carrier amount in the third regions of the first conductivity type.

In another embodiment, a semiconductor device can include the aforementioned semiconductor chip having the vertical drift section between the active section and the low resistance layer. Here, base regions of a second conductivity type on the side of the first major surface can be provided. An outermost one of the base regions can include a first portion doped relatively lightly and a second portion doped relatively heavily. The first portion can be covered partly with an insulator film in the outer area of the second portion, and the width of the first portion partly covered with the insulator film can be wider than the first pitch. The resistance value of the first portion partly covered with the insulator film in the outer area of the second portion can be 2 Ω or higher.

The previously mentioned peripheral section can be formed between the first major surface and the low resistance layer, and formed around the vertical drift section. The peripheral section can comprise an alternating conductivity type layer comprised of regions of the first conductivity type and regions of the second conductivity type arranged alternately along the first major surface. The regions of the first conductivity type and the regions of the second conductivity type arranged alternately in the peripheral section can repeat at a second pitch along at least in a portion of the alternating conductivity type layer of the peripheral section on the side of the first major surface. The second pitch can be narrower than the first pitch. Part of the portion of the alternating conductivity type layer of the peripheral section repeating at the second pitch can be arranged below the outermost one of the base regions.

Alternatively, a second alternating conductivity type layer between the portion of the alternating conductivity type layer of the peripheral section repeating at the second pitch and the low resistance layer can be formed. The second alternating conductivity type layer can comprise second regions of the first conductivity type and second regions of the second conductivity type arranged alternately at the first pitch repeating along the first major surface.

The semiconductor devices embodying the present invention can also have the impurity or carrier concentration or the carrier amount in the third regions of the second conductivity type can be at least 1.2 times higher than the respective impurity or carrier concentration or the carrier amount in the third regions of the first conductivity type. The width of the third regions of the second conductivity type also can be at least 1.2 times wider than the width of the third regions of the first conductivity type. The impurity concentrations in the second subsection can be lower than the impurity concentrations in the first subsection. The second subsection can be 0.5 times or less thick as the total thickness of the first subsection and the second subsection.

The active section can further include a region of the second conductivity type, and part of the second subsection can be arranged below an end portion of the region of the second conductivity type of the active section.

A channel stopper region of the first conductivity type can be formed around the first subsection and the second subsection. The channel stopper region can be connected to the low resistance layer. The second subsection can be covered with an insulator film. A field plate electrode can cover part of the second subsection with the insulator film interposed therebetween.

DETAILED DESCRIPTION

Figure 1:
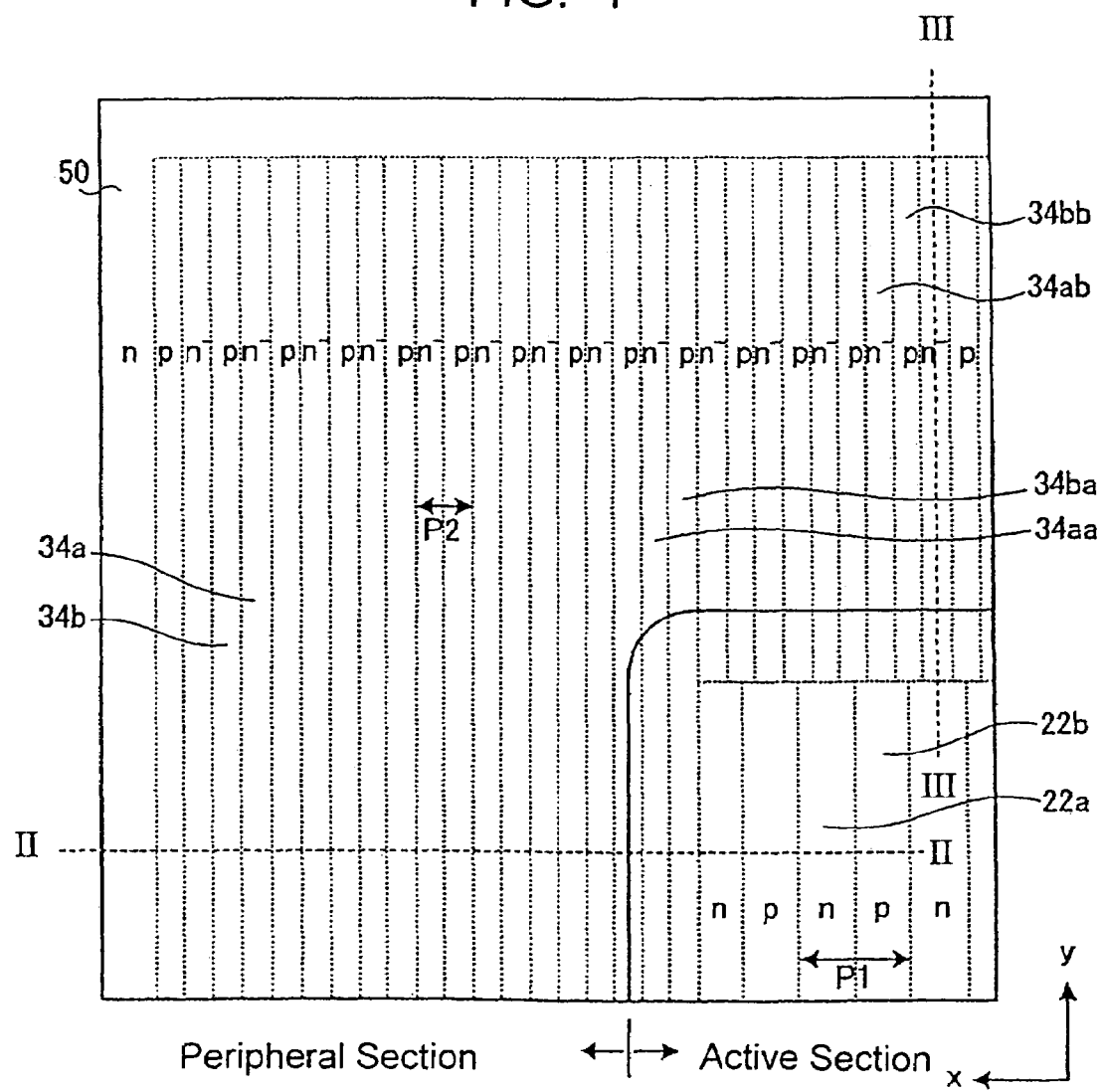
FIG. 1 is a top plan view of a first embodiment of a chip of a vertical MOSFET embodying the present invention.

Now the invention will be described in detail hereinafter with reference to the accompanied drawing figures that illustrate the preferred embodiments of the invention. In the following descriptions, the n-type layer or the n-type region is a layer or a region, with the electrons being the majority carriers. The p-type layer or the p-type region is a layer or a region, with the holes being the majority carriers. The superscript "+" following the letter "n" or "p" indicates that the conductivity type of the layer or the region is doped relatively heavily. The superscript "−" following the letter "n" or "p" indicates that the conductivity type of the layer or the region is doped relatively lightly.

Although the first conductivity type is described here as an n-type and the second conductivity type as a p-type in all the illustrated embodiments, the first conductivity type can be a p-type and the second conductivity type can be an n-type. Throughout the accompanied drawing figures, the same reference numerals are used to designate the same constituent elements and their duplicated descriptions are omitted for the sake of simplicity. Note that FIGS. 1, 7, 10, and 12 illustrate a quarter section of the drain drift section, the remaining three-quarter of the drain drift section being composed of substantially identical quarter sections (namely mirror configurations along the X and Y axes).

Figure 2:
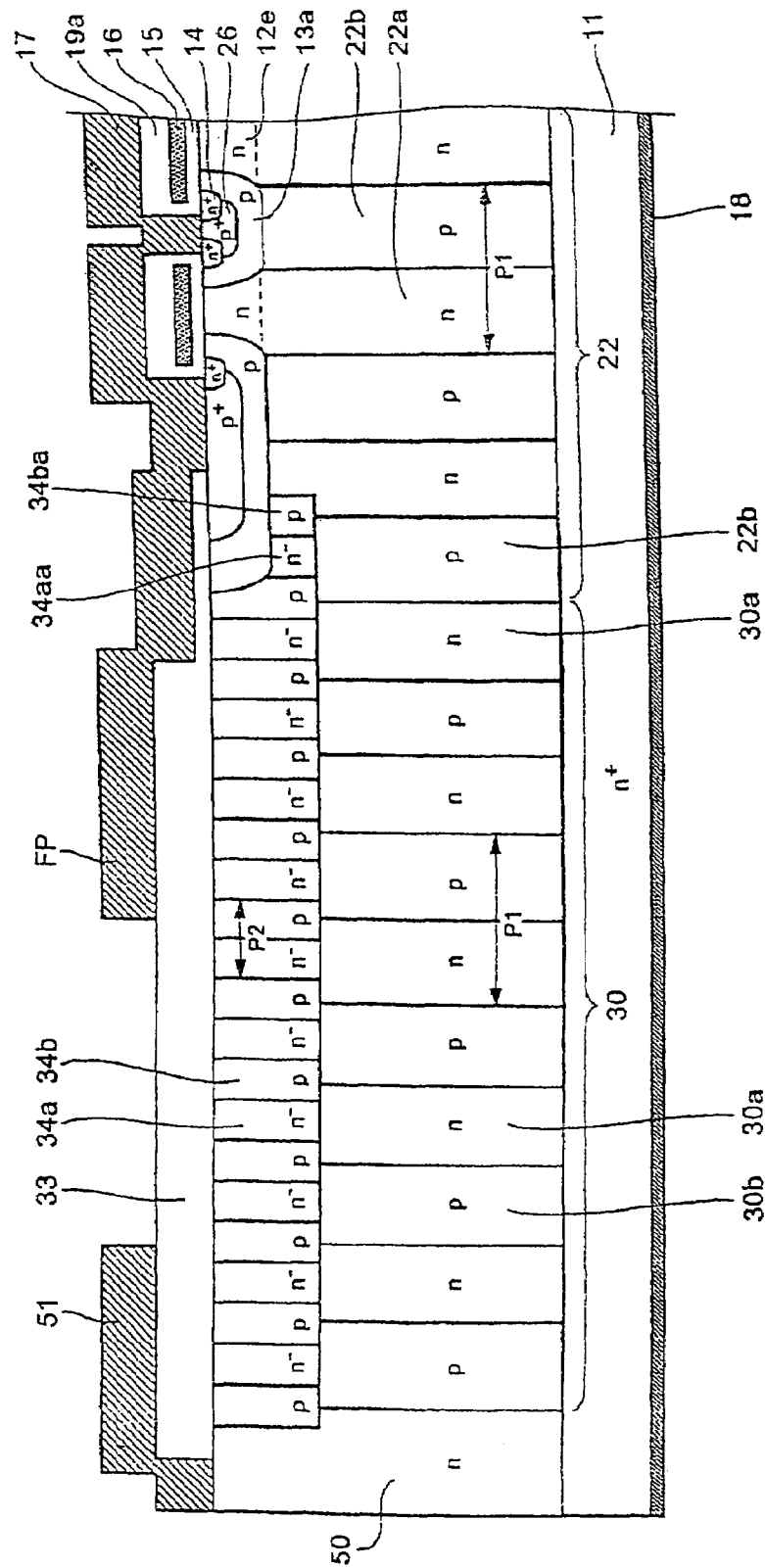
FIG. 2 is a cross sectional view taken along the line segment II-II of FIG. 1.
Figure 3:
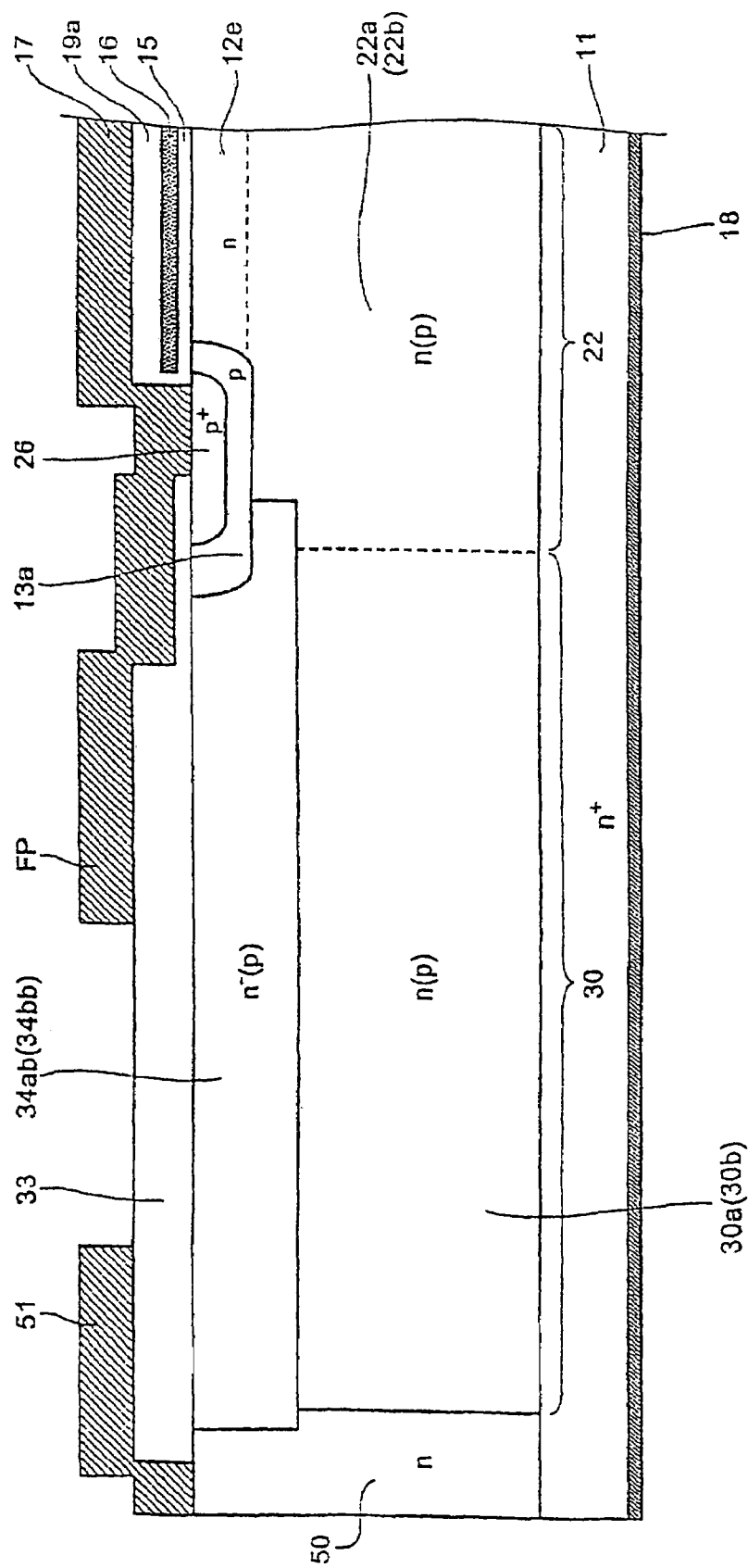
FIG. 3 is a cross sectional view taken along the line segment III-III of FIG. 1.
Figure 23:
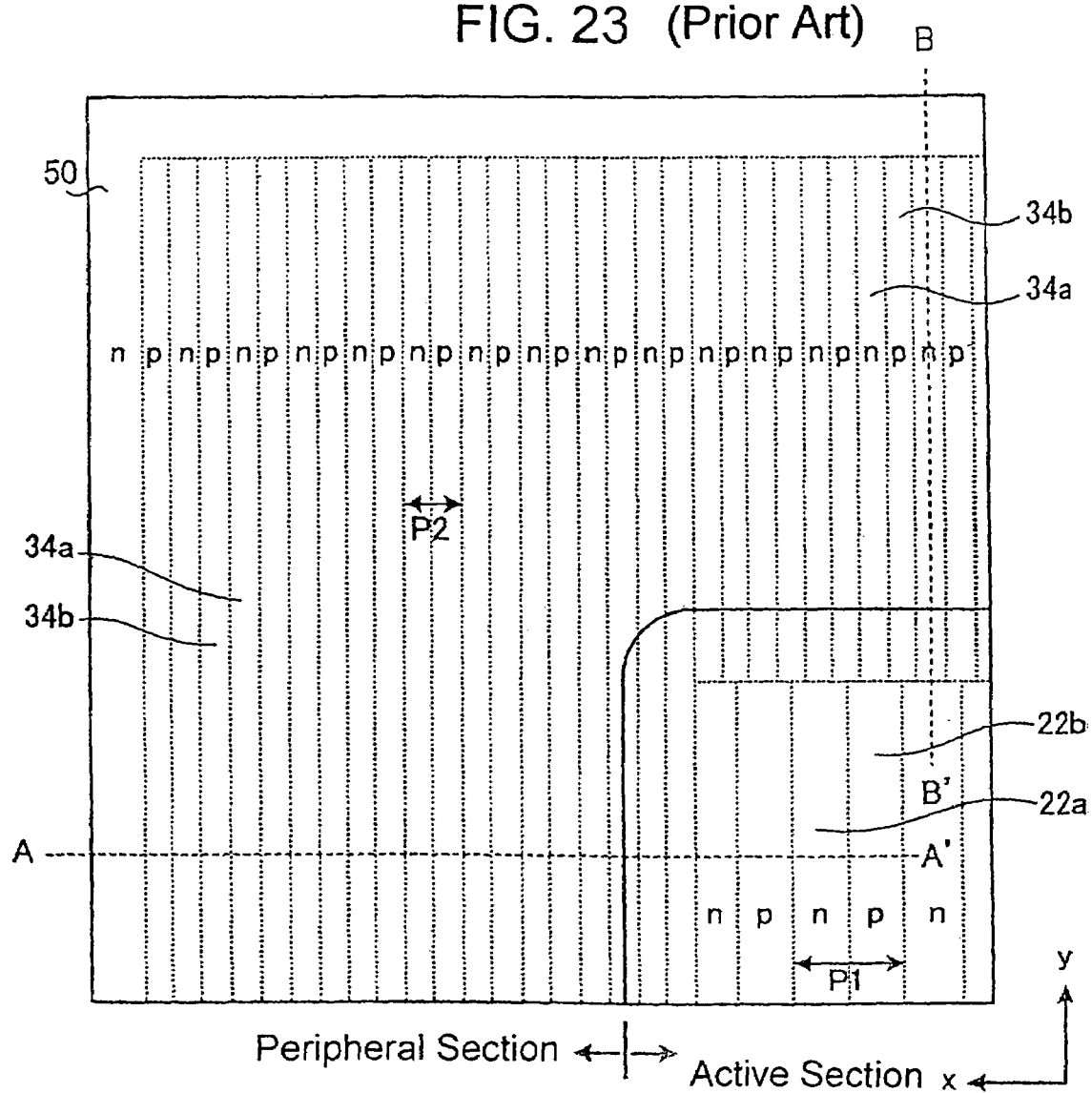
FIG. 23 is a top plan view of the chip of a conventional vertical MOSFET.
Figure 24:
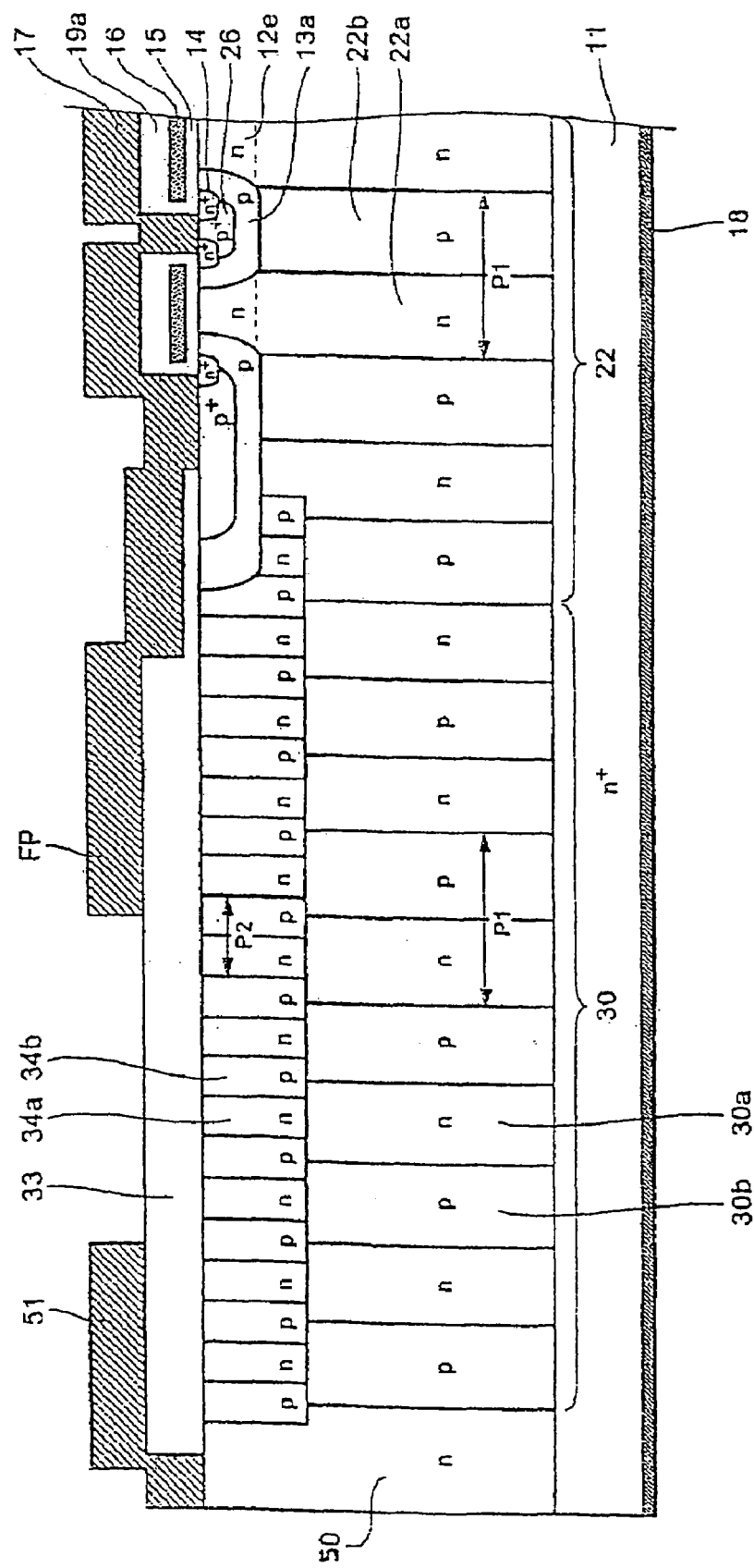
FIG. 24 is a cross sectional view along the line segment XXIV-XXIV of FIG. 23.
Figure 25:
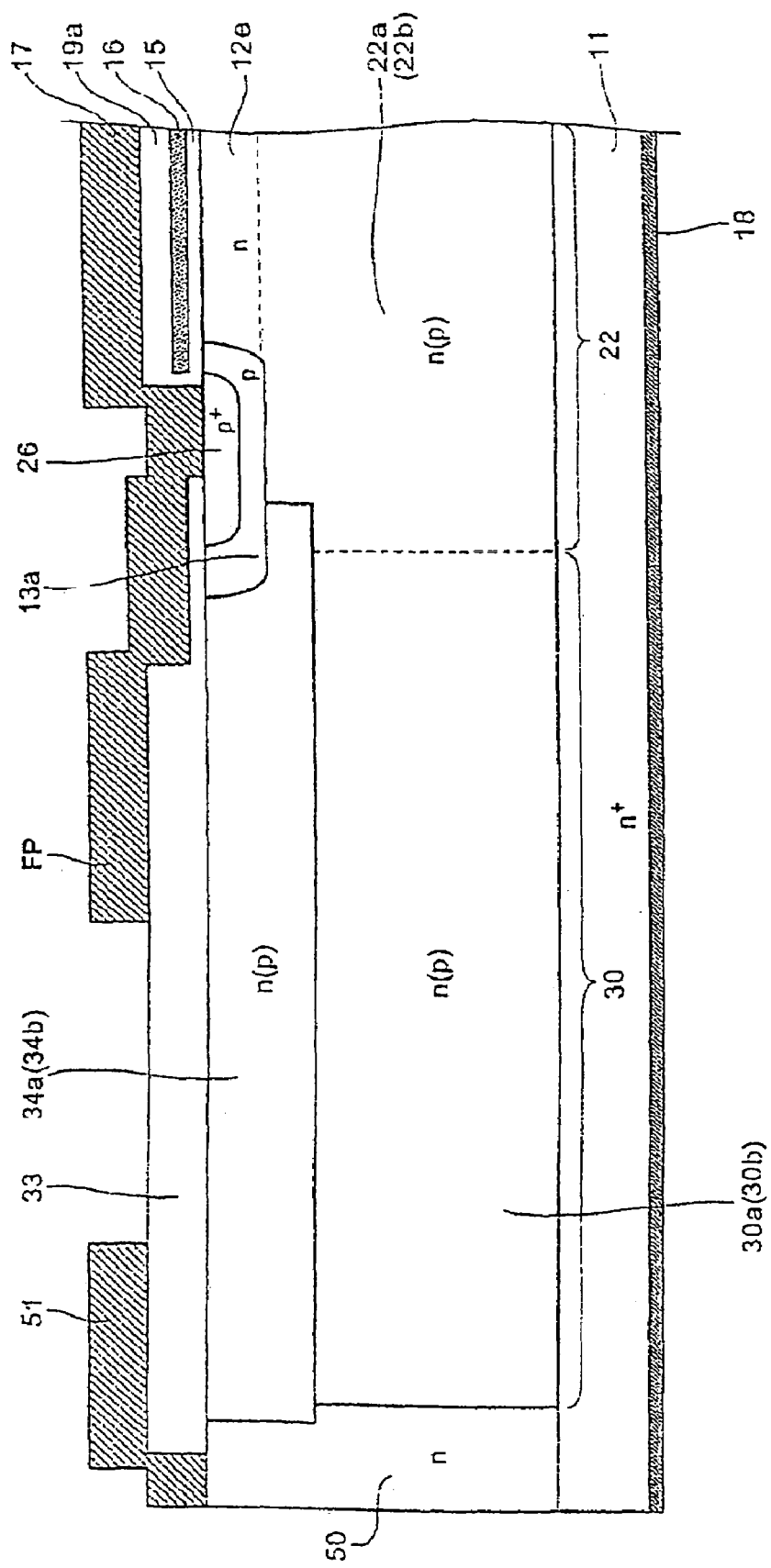
FIG. 25 is a cross sectional view along the line segment XXV-XXV of FIG. 23.

Referring to FIGS. 1-3, a vertical MOSFET according to the first embodiment is substantially similar to the conventional structure shown in FIGS. 23-25, except that the first embodiment has a higher impurity concentration in its third p-type regions 34*b*, 34*ba*, and 34*bb* than that of its third n-type regions 34*a*, 34*aa*, and 34*ab*, respectively.

As shown in FIG. 1, the planar patterns of the constituent regions in its first through third alternating conductivity type layers are stripes extending parallel to each other. In the third alternating conductivity type layer, the width of each of the third n-type regions 34*a*, 34*aa*, and 34*ab* and the width of each of the third p-type regions 34*b*, 34*ba*, and 34*bb*, respectively, are substantially the same. Since the second alternating conductivity type layer is continuous with the first alternating conductivity type layer as shown in FIG. 2, no transient region, in which the pitch of repeating becomes discontinuous, is formed. To prevent lowering of the breakdown voltage by the charge imbalance, it is preferable to set the thickness of the third alternating conductivity type layer equal to or thinner than half the total thickness of the second and third alternating conductivity type layers.

The inner portions of the third p-type region 34*ba* and the third n-type region 34*aa* neighboring the first alternating conductivity type layer extend below the bottom of the p-type base region 13*a*. In the same manner, the inner portions of the vertical-layer-shaped third p-type regions 34*bb* and the vertical-layer-shaped third n-type regions 34*ab* in butting contact with the first n-type regions 22*a* and the first p-type regions 22*b* in the first alternating conductivity type layer extend below the bottoms of the p-type base regions 13*a* as shown in FIG. 3.

For the vertical MOSFET according to the first embodiment exhibiting a breakdown voltage of the 600 V class, the sizes and the impurity concentrations of the constituent portions can be as follows, although not limited thereto. The thickness (in the depth direction) of the drain drift section 22 can be 44.0 μm. The first n-type region 22*a* and the first p-type region 22b each can be 8.0 µm in width so that the pitch P1 can be 16.0 µm. The impurity concentration in each of the first n-type region 22a and the first p-type region 22b can be $2.4 \times 10^{15}$ cm$^{-3}$. The thickness (in the depth direction) of the second alternating conductivity type layer in the peripheral section 30 can be 31.0 µm. The second n-type region 30a and the second p-type region 30b each can be 8.0 µm in width so that the pitch P1 can be 16.0 µm. The impurity concentration in each of the second n-type region 30a and the second p-type region 30b can be $2.4 \times 10^{15}$ cm$^{-3}$. The thickness (in the depth direction) of the third alternating conductivity type layer in the peripheral section 30 can be 13.0 µm. The third n-type regions 34a, 34aa, 34ab and the third p-type regions 34b, 34ba, 34bb each can be 4.0 µm in width so that the pitch P2 can be 8.0 µm. The impurity concentration in each of the third n-type regions 34a, 34aa, and 34ab can be $4.8 \times 10^{14}$ cm$^{-3}$. The impurity concentration in each of the third p-type regions 34b, 34ba, 34bb can be $7.2 \times 10^{14}$ cm$^{-3}$. The diffusion depth of the p-type base region 13a can be 3.0 µm. The surface impurity concentration in the p-type base region 13a can be $3.0 \times 10^{17}$ cm$^{-3}$. The diffusion depth of the n$^+$-type source region 14 can be 1.0 µm. The surface impurity concentration in the n$^+$-type source region 14 can be $3.0 \times 10^{20}$ cm$^{-3}$. The diffusion depth of the sandwiched region 12e can be 2.5 µm. The surface impurity concentration in the sandwiched region 12e can be $2.0 \times 10^{16}$ cm$^{-3}$. The n$^+$-type drain layer can be 300 µm in thickness. The impurity concentration in the n$^+$-type drain layer 11 can be $2.0 \times 10^{18}$ cm$^{-3}$. The n-type channel stopper region 50 can be 30.0 µm in width. The impurity concentration in the n-type channel stopper region 50 can be $6.0 \times 10^{15}$ cm$^{-3}$.

The impurity concentrations (namely impurity amounts) in the alternating conductivity type layers described above mean the carrier concentrations (namely carrier amounts). Note that it will be difficult to sufficiently improve the avalanche withstanding capability if the carrier concentrations are low. Accordingly, the impurity concentrations are made high. Usually, the impurity concentration and the carrier concentration in the region sufficiently activated can be deemed equivalent to each other. In the same manner, the impurity amount and the carrier amount in the region sufficiently activated can be deemed equivalent to each other. Therefore, the impurity concentrations include the carrier concentrations and the impurity amounts include the carrier amounts in this specification for the sake of convenience.

Now the principle of formation of negative resistance during the avalanche breakdown will be described below. An avalanche breakdown occurs when the electric field in the corner portion of the p-type base region 13a is made to reach the critical electric field by the voltage applied between the drain and the source, and between the drain and the gate. As soon as the avalanche breakdown occurs, an avalanche current starts flowing. As the avalanche current increases, the carriers caused by the avalanche increase. Holes and electrons are accumulated respectively on the upper surface side and the lower surface side of the semiconductor chip, causing redistribution of the electric field. The holes redistribute the electric field such that the high electric field region is removed from the corner portion to the bottom portion of the p-type base region 13a. Accordingly, the avalanche voltage after the electric field redistribution can be represented by the product of the electric field strength in the vertical direction after the electric field redistribution and the thickness of the depletion layer.

As the avalanche current further flows and the mobile carriers caused by the avalanche increase, the electric field distribution profile in the vertical direction becomes more convex downward. In other words, narrowing the distances between the equipotential curves in the vertical direction lowers the avalanche voltage and forms negative resistance. To improve the avalanche withstanding capability, that is, to raise the avalanche voltage at which negative resistance occurs, it is effective to provide a portion in the peripheral section 30 below the p-type base region 13a, including the third and second alternating conductivity type layers with a structure that facilitates to relax the electric field on the upper surface side when the avalanche current flows.

According to the first embodiment, the portion of the third alternating conductivity type layer arranged below the p-type base region 13a is provided with a structure that facilitates to relax the electric field on the upper surface side by setting the impurity concentration in the third p-type region 34ba higher than the impurity concentration in the third n-type region 34aa. In detail, the impurity concentration in the third p-type base regions 34b, 34ba, and 34bb is set 1.5 times as high as the impurity concentrations in the third n-type base regions 34a, 34aa, and 34ab. For obtaining sufficient electric field relaxation effects, it is desirable to set the impurity concentration in the third p-type base regions 34b, 34ba, and 34bb to be at least 1.2 times as high as the impurity concentration in the third n-type base regions 34a, 34aa, and 34ab.

Figure 4:
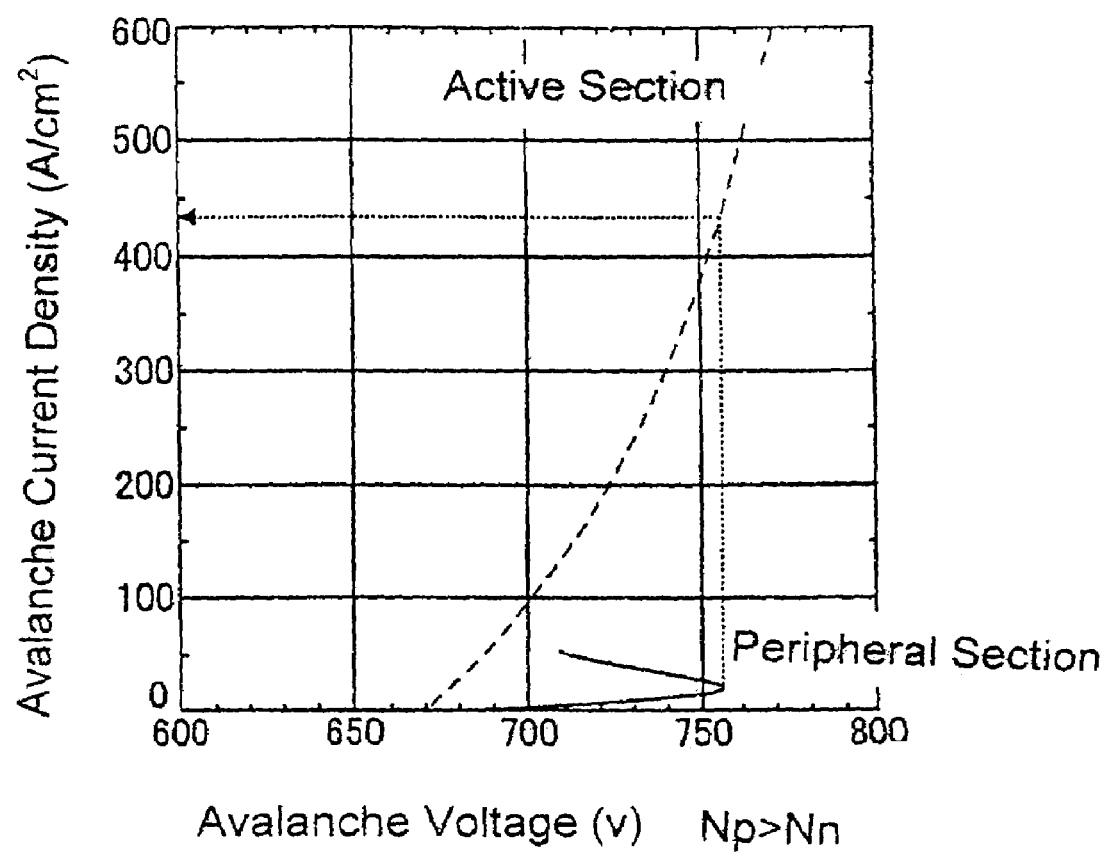
FIG. 4 is a graph describing the simulation results on the avalanche breakdown in the portion along the line segment II-II of FIG. 1 for the impurity concentration Np in the p-type regions higher than the impurity concentration Nn in the n-type region.
Figure 5:
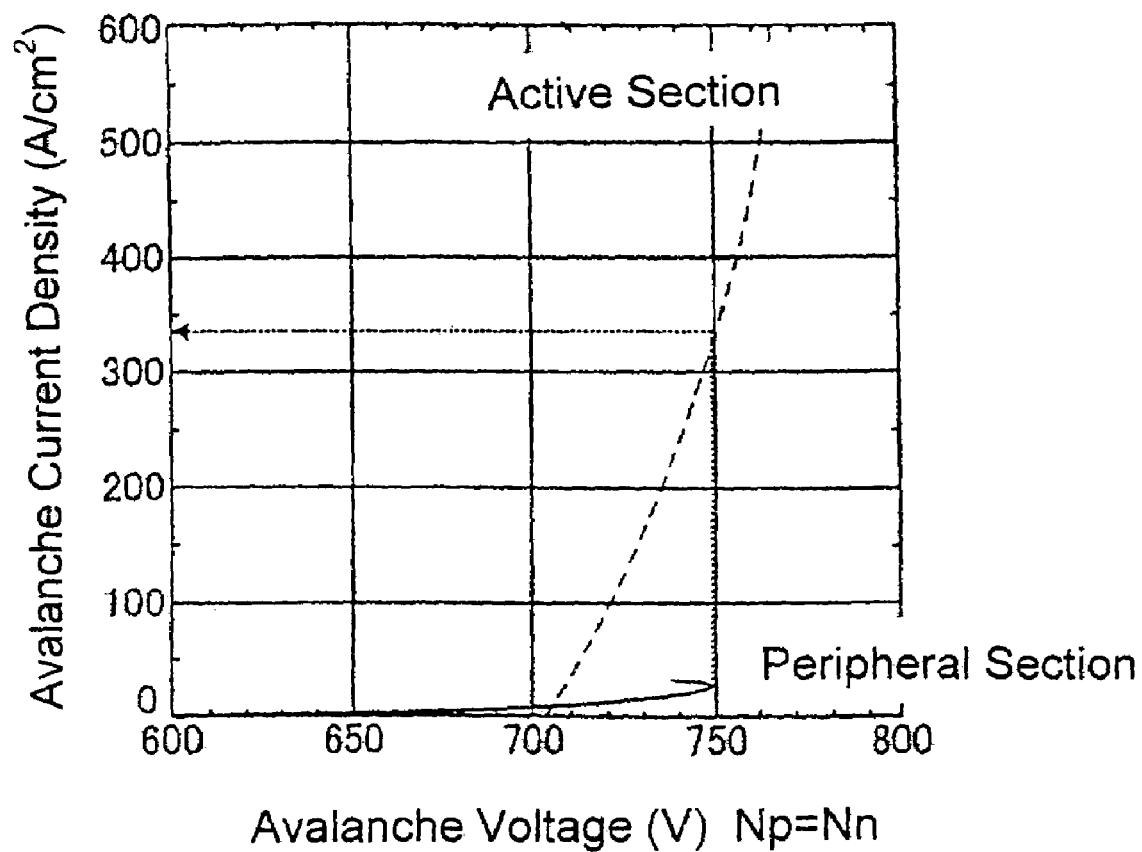
FIG. 5 is a graph describing the simulation results on the avalanche breakdown in the portion taken along the line segment II-II of FIG. 1 for the impurity concentration Np in the p-type regions equal to the impurity concentration Nn in the n-type region.
Figure 6:
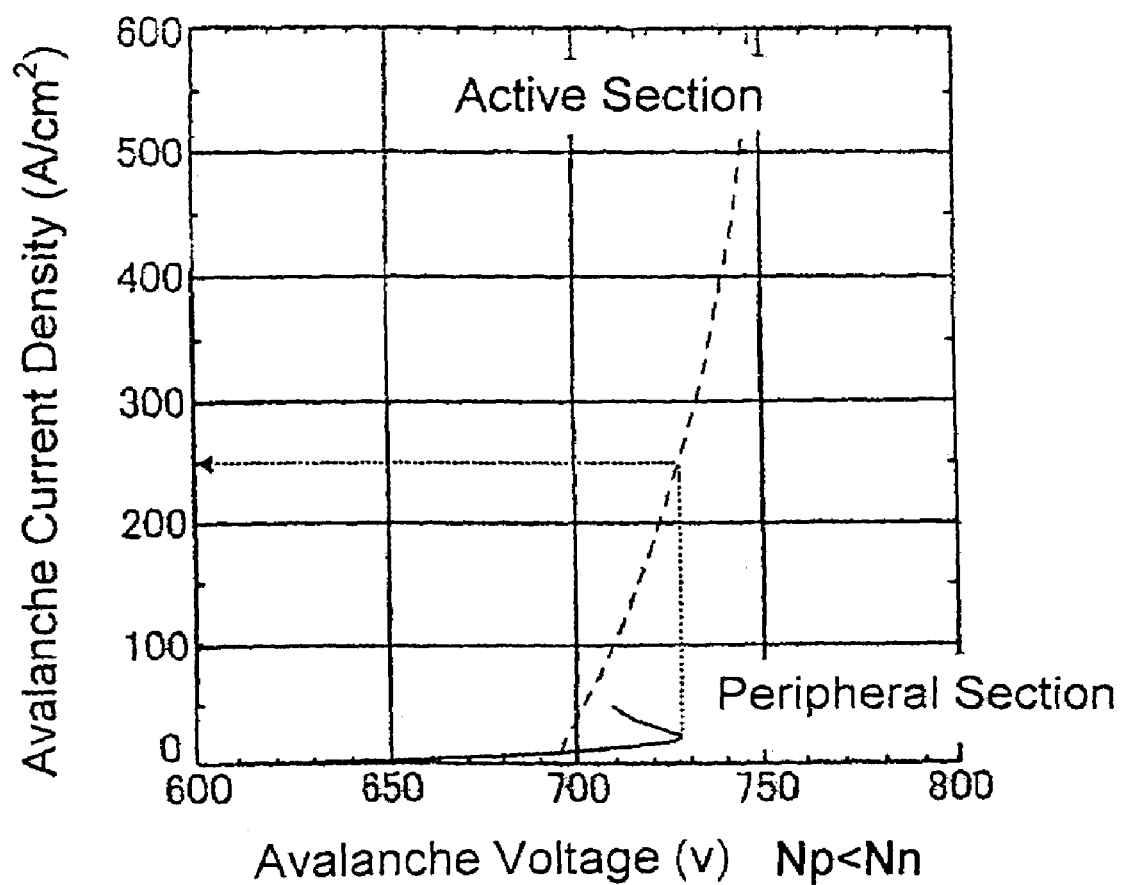
FIG. 6 is a graph describing the simulation results on the avalanche breakdown in the portion along the line segment II-II of FIG. 1 for the impurity concentration Np in the p-type regions lower than the impurity concentration Nn in the n-type region.

The present inventors have conducted simulations on the current vs. voltage characteristics of the peripheral and active sections in the avalanche breakdown of a vertical MOSFET of the 600 V class having the structure shown in FIGS. 1-3. The results are illustrated in FIGS. 4-6. In the simulations, the sizes and the impurity concentrations in the constituent portions of the alternating conductivity type layers are set at the values described above for the MOSFET according to the first embodiment. Considering the impurity concentration variations, the impurity concentration Nn in the n-type regions is set to be lower by 10% than the impurity concentration Np in the p-type regions in FIG. 4, the impurity concentration Nn in the n-type regions is set to be equal to the impurity concentration Np in the p-type regions in FIG. 5, and the impurity concentration Nn in the n-type regions is set to be higher by 10% than the impurity concentration Np in the p-type regions in FIG. 6.

Figure 26:
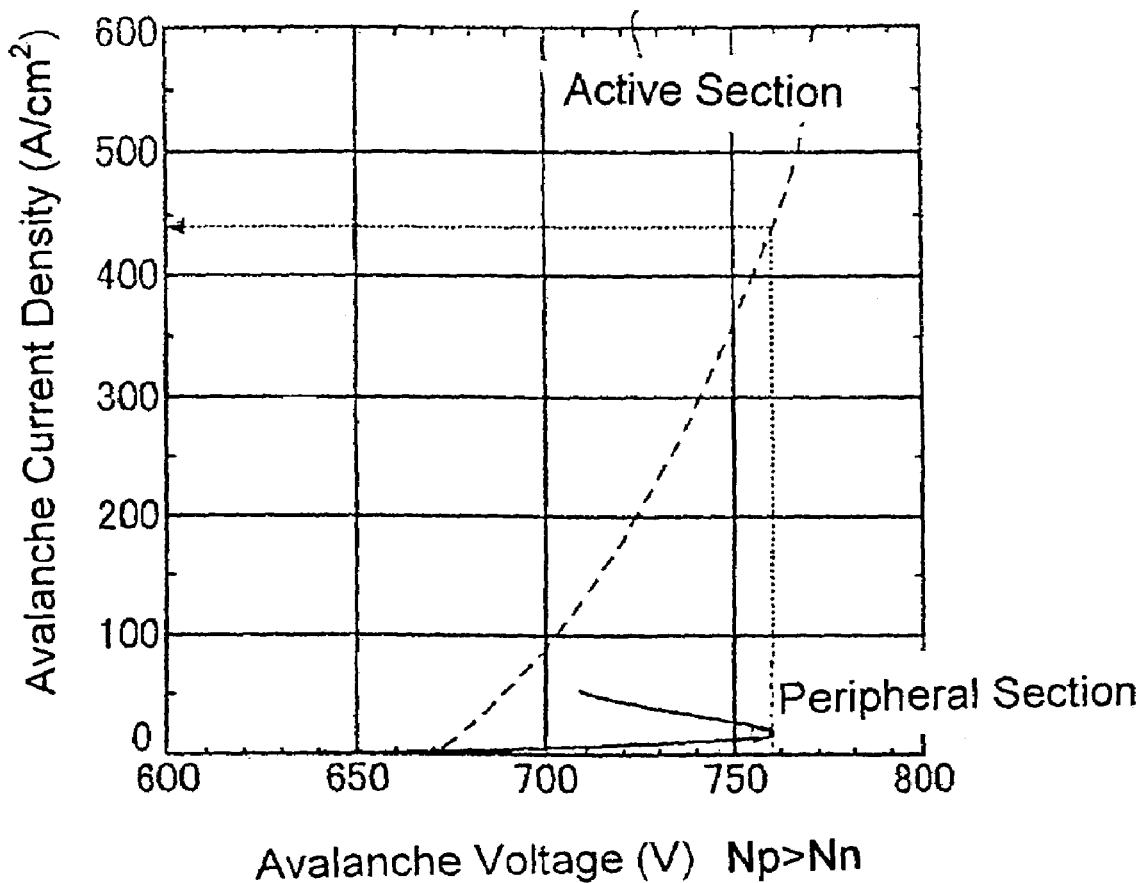
FIG. 26 is a graph describing the simulation results on the avalanche breakdown in the portion along the line segment XXIV-XXIV of FIG. 23 for the impurity concentration Np in the p-type regions higher than the impurity concentration Nn in the n-type region.
Figure 27:
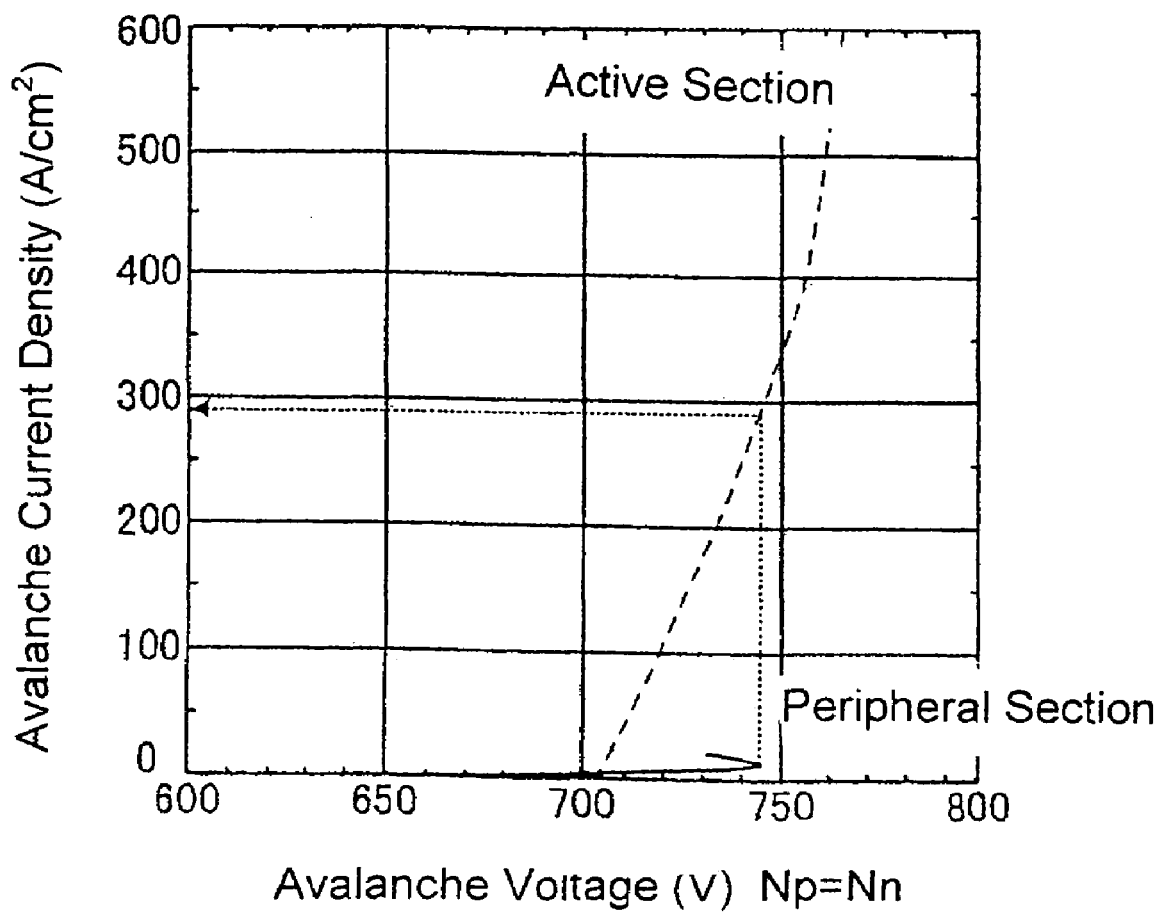
FIG. 27 is a graph describing the simulation results on the avalanche breakdown in the portion along the line segment XXIV-XXIV of FIG. 23 for the impurity concentration Np in the p-type regions equal to the impurity concentration Nn in the n-type region.
Figure 28:
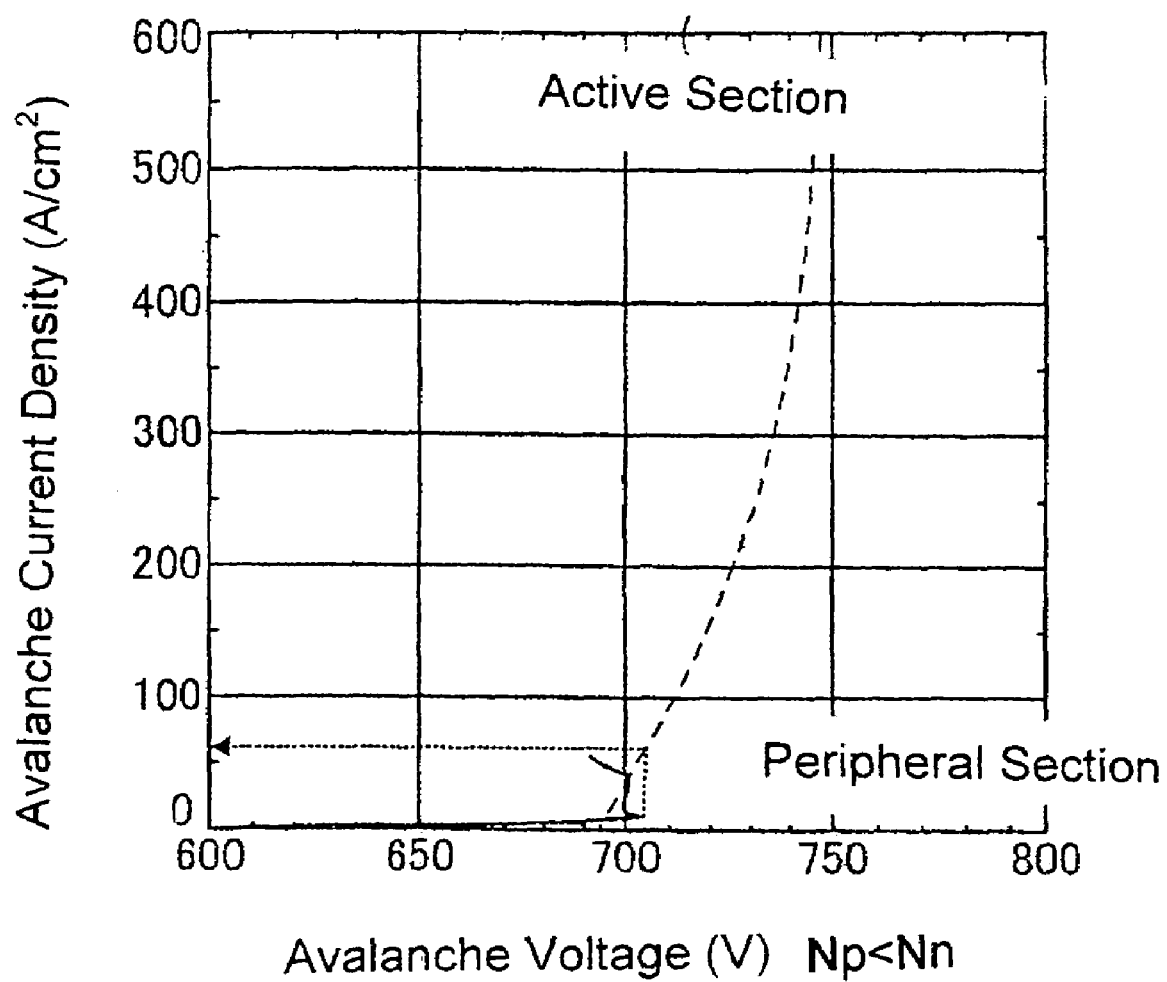
FIG. 28 is a graph describing the simulation results on the avalanche breakdown in the portion along the line segment XXIV-XXIV of FIG. 23 for the impurity concentration Np in the p-type regions lower than the impurity concentration Nn in the n-type region.

Comparing FIGS. 4-6 with FIGS. 26-28 (for the conventional MOSFET), the avalanche voltage, at which negative resistance occurs in the peripheral section 30, in the MOSFET according to the first embodiment is higher in all cases than the avalanche voltage in the conventional MOSFET. Since the avalanche current that can be made to flow in the active section of the MOSFET according to the first embodiment is higher, the MOSFET according to the first embodiment improves the avalanche withstanding capability. Even when the impurity concentration in the n-type regions varies by ±10%, the avalanche withstanding capability of 250 A/cm$^2$ or more can be obtained. Moreover, since the third p-type region 34b works also as a guard ring, the breakdown voltage is secured easily. In the y-direction in FIG. 1, namely in the direction parallel to the stripes of the alternating conductivity type structures, the breakdown voltage is hardly lowered, since the third alternating conductivity type layer is sandwiched between the p-type base regions 13a and the n-type channel stopper region 50.

By setting the impurity concentrations in the third alternating conductivity type layer lower than the impurity concentrations in the second alternating conductivity type layer, the surface electric field in the vicinity of the active section is relaxed and a high breakdown voltage can be obtained easily. Since there exists no transient region, in which the pitch of repeating alternately arranged n-type regions and p-type regions changes, between the first and second alternating conductivity type layers, and since the third alternating conductivity type layer is thin, lowering of the breakdown voltage lowering is prevented between the first and second alternating conductivity type layers. The provision of the n-type channel stopper region 50 further stabilizes the breakdown voltage. Since the voltage component shared by the oxide film 33 below the field plate electrode FP compensates the breakdown voltage drop caused by the charge imbalance in the transient region, in which the pitch of repeating alternately arranged n-type regions and p-type regions changes, due to the provision of the field plate electrode FP, the breakdown voltage is secured easily.

Figure 7:
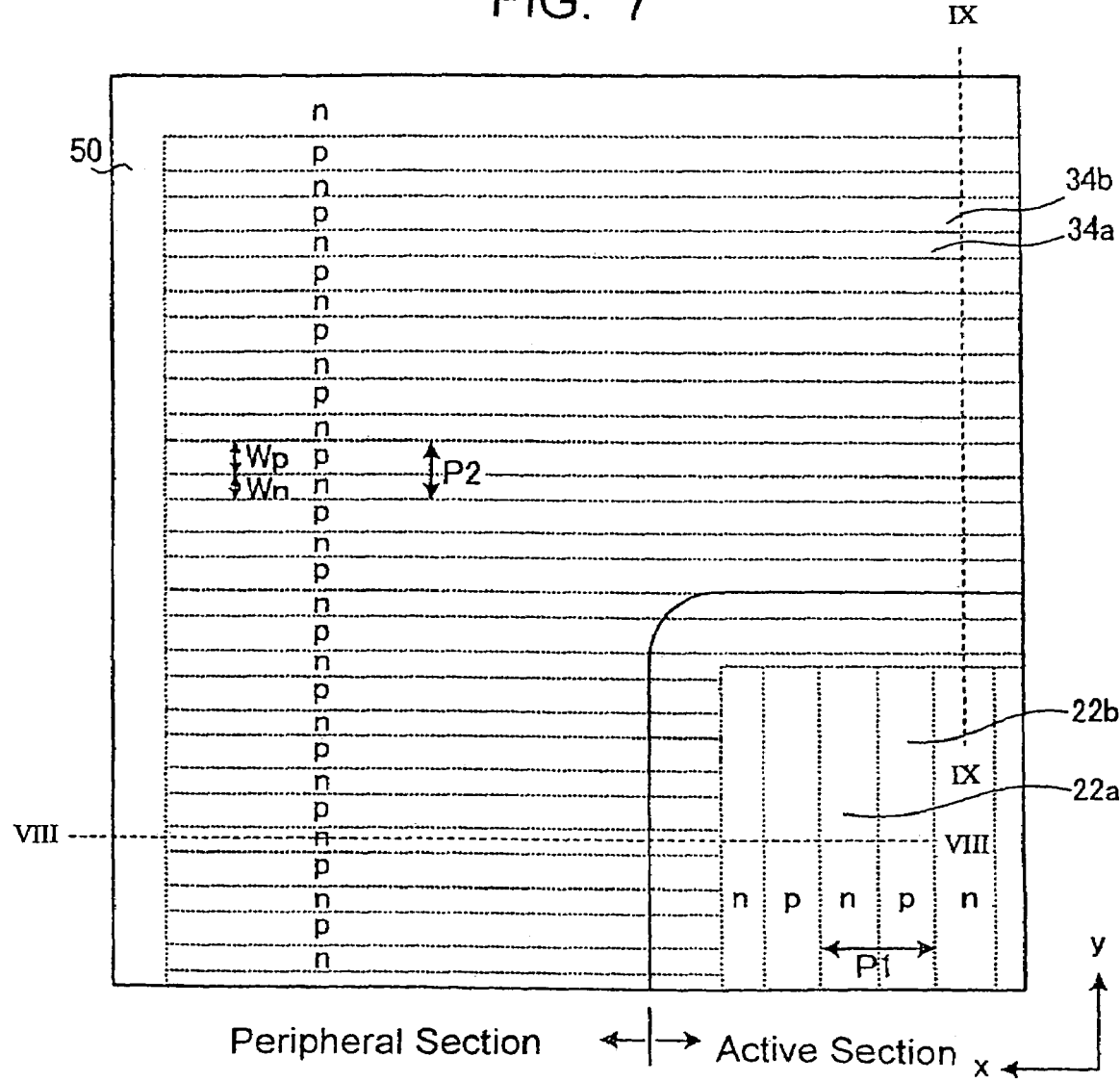
FIG. 7 is a top plan view of a second embodiment of the chip of a vertical MOSFET embodying the present invention.
Figure 8:
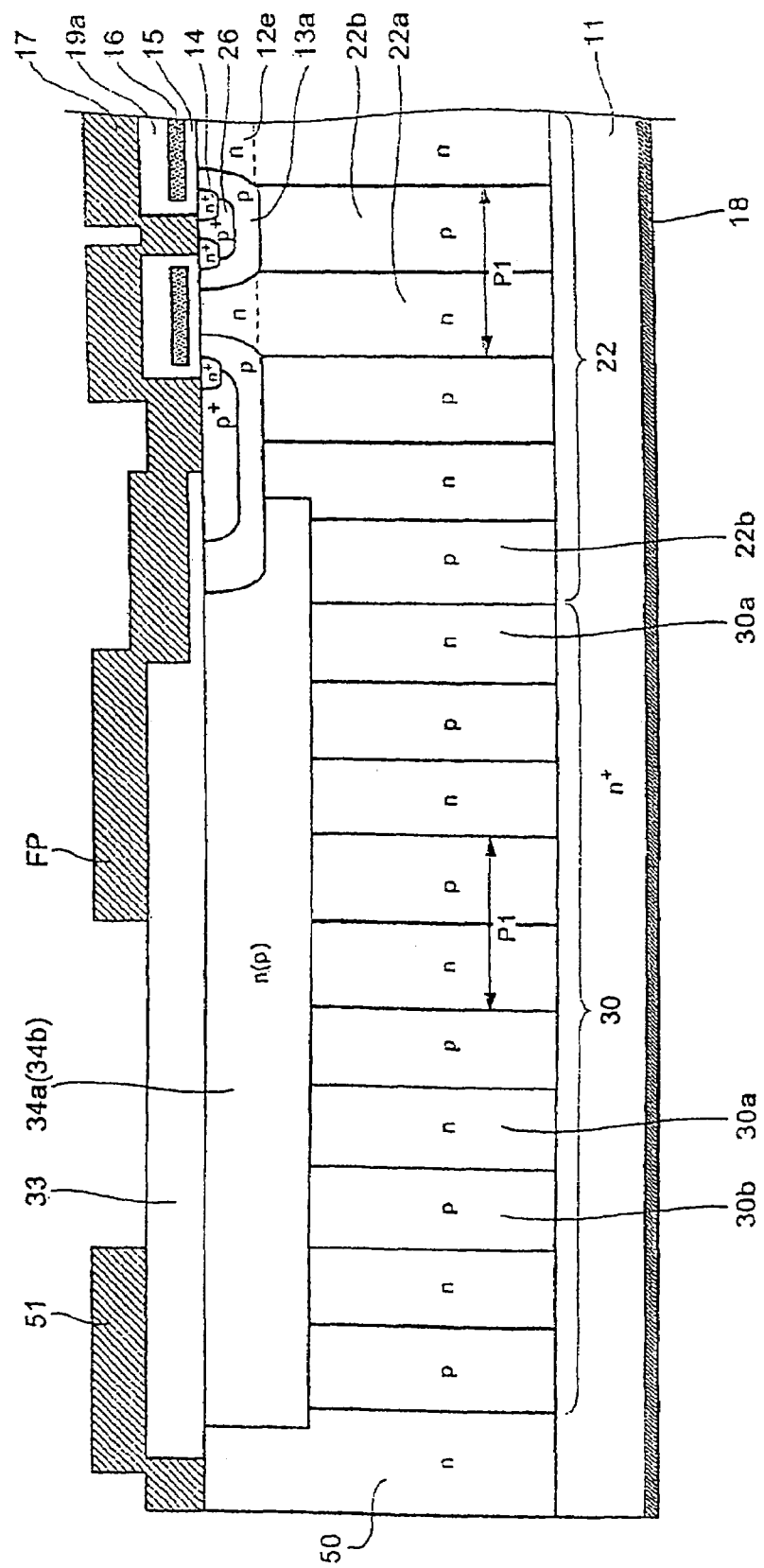
FIG. 8 is a cross sectional view along the line segment VIII-VIII of FIG. 7.
Figure 9:
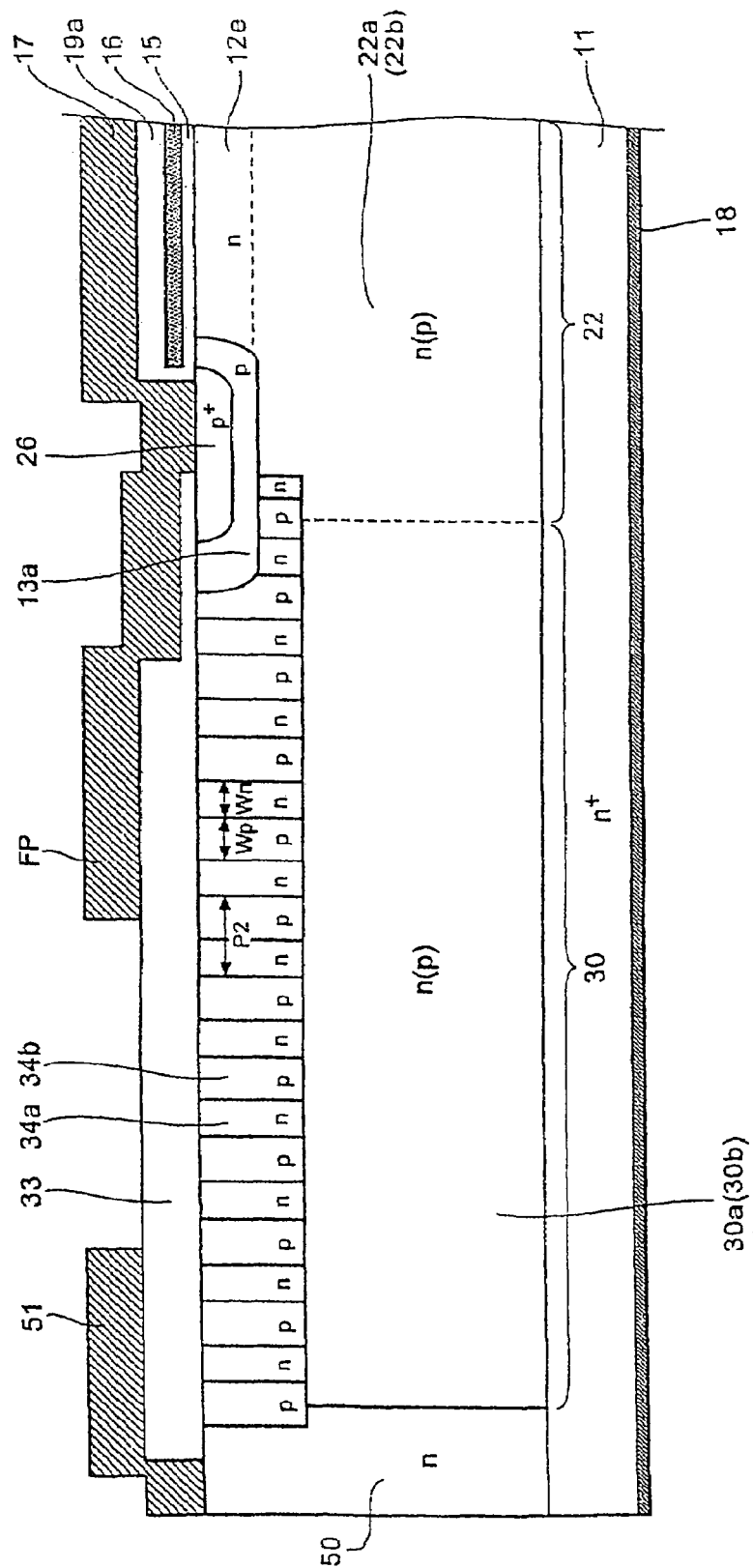
FIG. 9 is a cross sectional view along the line segment IX-IX of FIG. 7.

Referring to FIGS. 7-9, the second embodiment is a variation of the first embodiment. Here, the impurity concentration in its third n-type region 34a is the same as the impurity concentration in its third p-type region 34b, but the width Wp of its third p-type region 34b is wider than the width Wn of its third n-type region 34a. For example, the impurity concentration in its third n-type region 34a and its third p-type region 34b can be $4.8 \times 10^{14}$ cm$^{-3}$. For example, the width Wp of its third p-type region 34b can be 1.2 times or more as wide as the width Wn of its third n-type region 34a.

The direction of the pitch of repetition in the third alternating conductivity type layer in the peripheral section 30 is perpendicular to the direction of the pitch of repetition in the first alternating conductivity type layer in its drain drift section 22. As to the thickness of the third alternating conductivity type layer, the pitch P2 thereof is narrow, sufficiently narrower than the thickness of the first alternating conductivity type layer. Accordingly, no problem is posed regardless of whether the direction of the alternately arranged n-type regions and p-type regions in the third alternating conductivity type layer is perpendicular or parallel to the direction of the alternately arranged n-type regions and p-type regions in the first alternating conductivity type layer.

Since the MOSFET according to the second embodiment realizes charge imbalance by widening the width Wp of the third p-type regions 34b, the MOSFET according to the second embodiment exhibits the same effects as those the MOSFET according to the first embodiment. For controlling the impurity amount in the third p-type regions 34b, it is easier to control the width of the third p-type regions 34b than to control the impurity concentration in the third p-type regions 34b. Therefore, the MOSFET according to the second embodiment exhibits a higher mass-productivity than the MOSFET according to the first embodiment. Since the direction of alternately arranging the n-type regions and the p-type regions in the third alternating conductivity type layer and the direction of alternately arranging the n-type regions and the p-type regions in the first alternating conductivity type layer cross each other, more freedoms are secured for designing the MOSFET according to the second embodiment.

Figure 10:
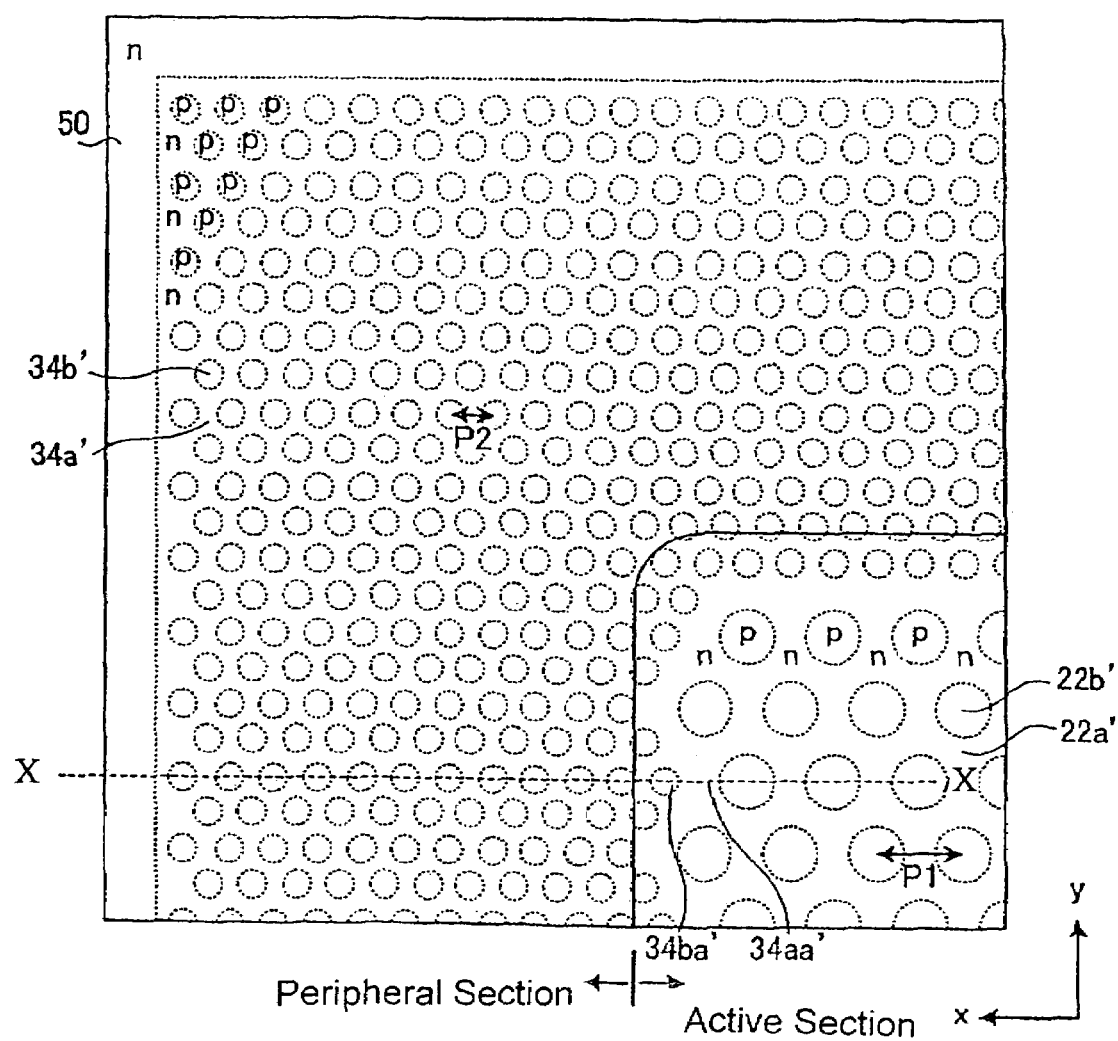
FIG. 10 is a top plan view of a third embodiment of the chip of a vertical MOSFET embodying the present invention.
Figure 11:
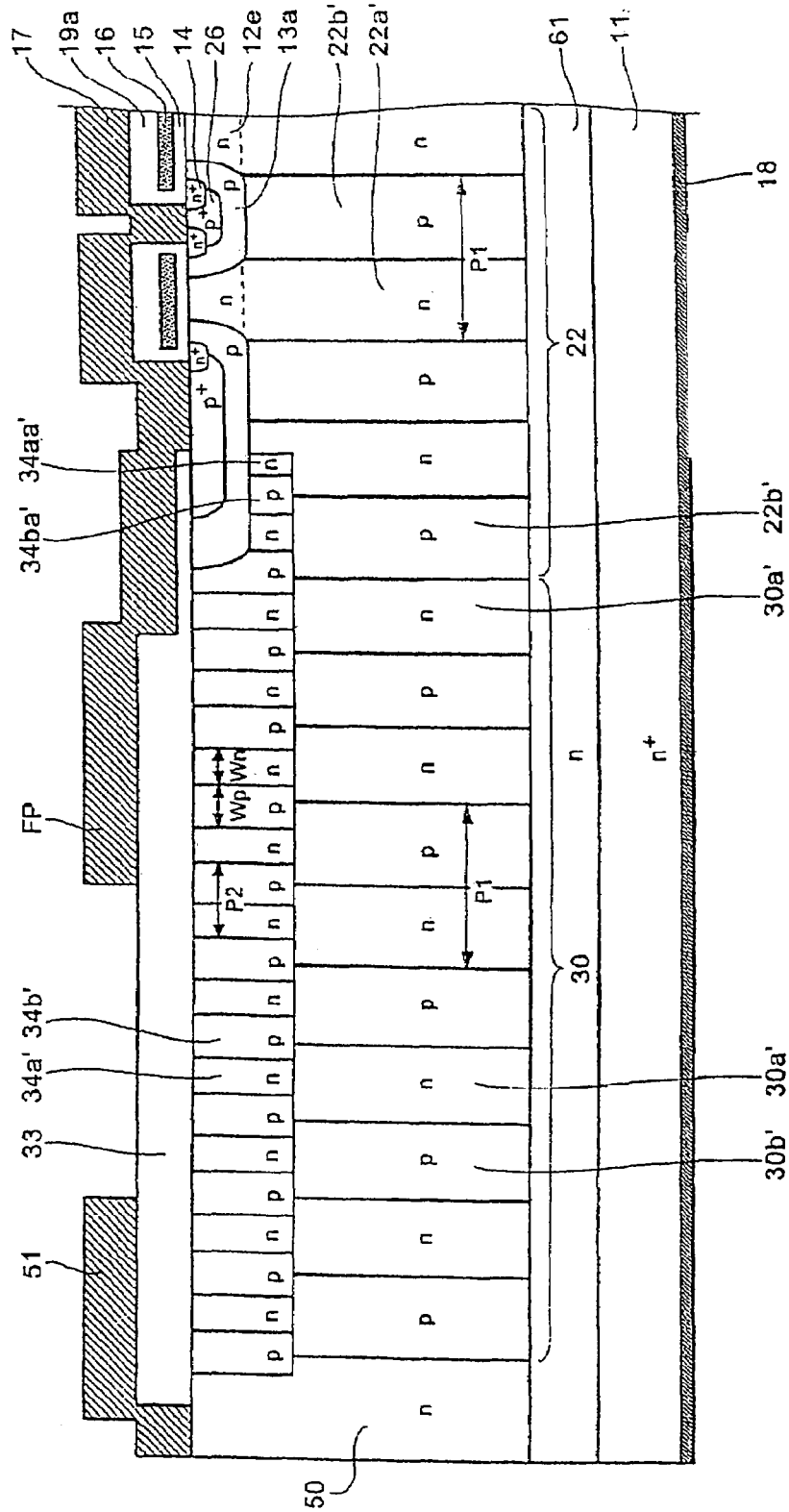
FIG. 11 is a cross sectional view along the line segment X-X of FIG. 10.

Referring to FIGS. 10 and 11, the third embodiment is a variation of the second embodiment. Here, referring to FIG. 11, its p-type regions 22b' and 30b', and 34b' in its first, second, and third alternating conductivity type layers and its n-type regions 22a' and 30a', and 34a' in its first, second, and third alternating conductivity type layers are vertical layers. The p-type regions 22b' and 30b', and 34b' are substantially shaped as cylindrical rods, and are configured or positioned at the lattice points of respective hexagonal planar lattices. The n-type region 22a' occupies the remaining space around the p-type regions 22b', the n-type region 30a' occupies the remaining space around the p-type regions 30b', and the n-type region 34a' occupies the remaining space around the p-type regions 34b'. The n-type regions 22a', 30a', and 34a' can be shaped as respective cylindrical rods positioned at the lattice points of respective hexagonal planar lattices and the p-type regions 22b', 30b', and 34b' can occupy the remaining spaces around the p-type regions 22b', 30b', and 34b'.

If the impurity amount in the third p-type regions 34b' is larger than the impurity amount in the third n-type regions 34a' in the third alternating conductivity type layer, the cylindrical-rods-shaped regions in the first through third alternating conductivity type layers can be positioned at the lattice points of planar trigonal lattices, planar orthogonal lattices, and such planar polygonal lattices. Further, the regions of one conductivity type in any of the alternating conductivity type layers can be positioned at the lattice points of a planar polygonal lattice and the regions in the other alternating conductivity type layers can be shaped with respective stripes. The portion of the third n-type region 34aa' and the third p-type region 34ba' is below the p-type base region 13a.

As shown in FIG. 11, an n-type buffer region 61 is formed between the n$^+$-type drain layer 11 and the first and second alternating conductivity type layers. The n-type buffer region 61, however, can be omitted. The avalanche withstanding capability is improved according to the third embodiment since the voltage, at which negative resistance is formed during the avalanche breakdown, can be raised independently of the planar patterns of the alternating conductivity type structures and independently of the existence and nonexistence of the n-type buffer region 61.

Figure 12:
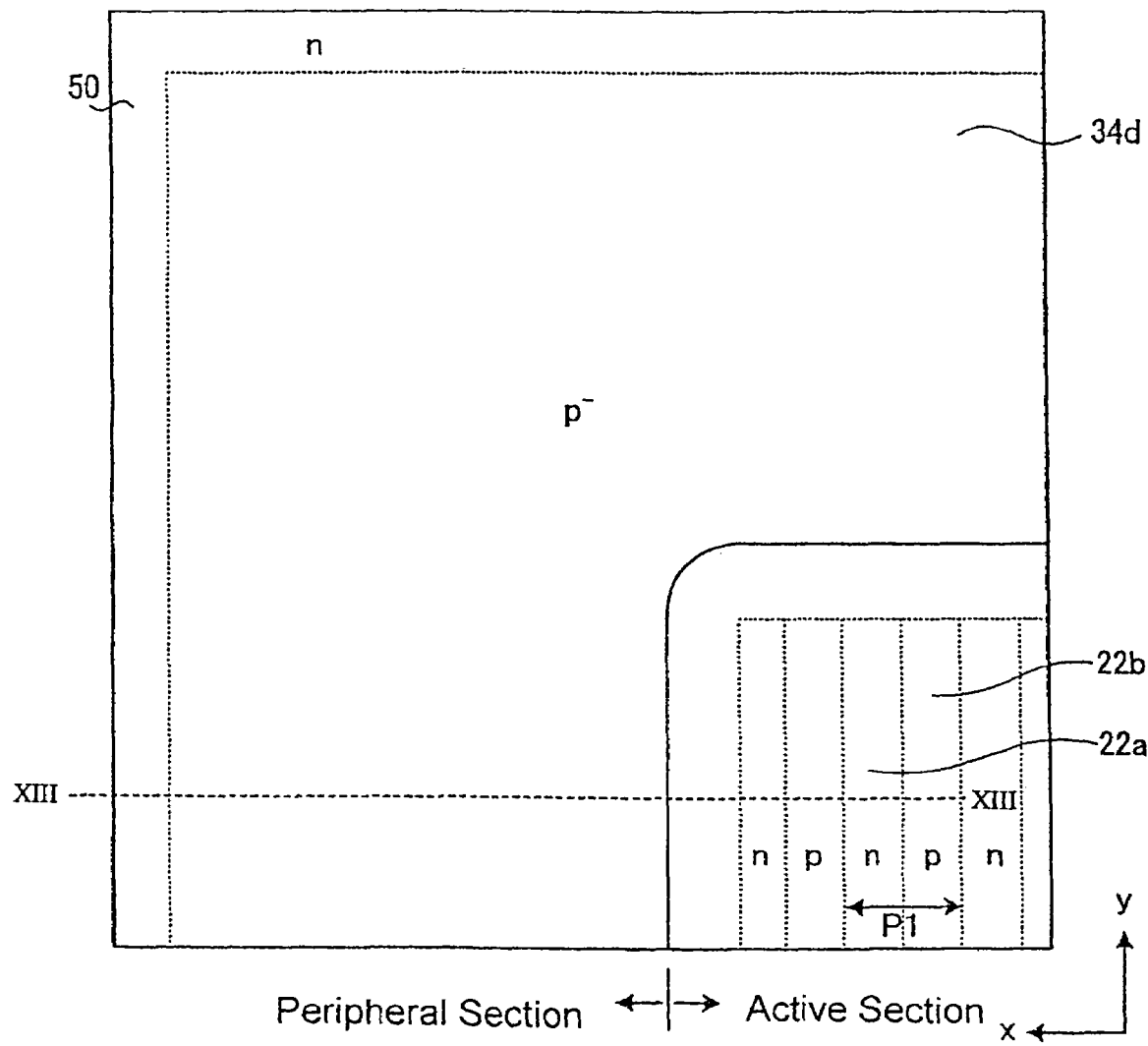
FIG. 12 is a top plan view of a fourth embodiment of the chip of a vertical MOSFET embodying the present invention.
Figure 13:
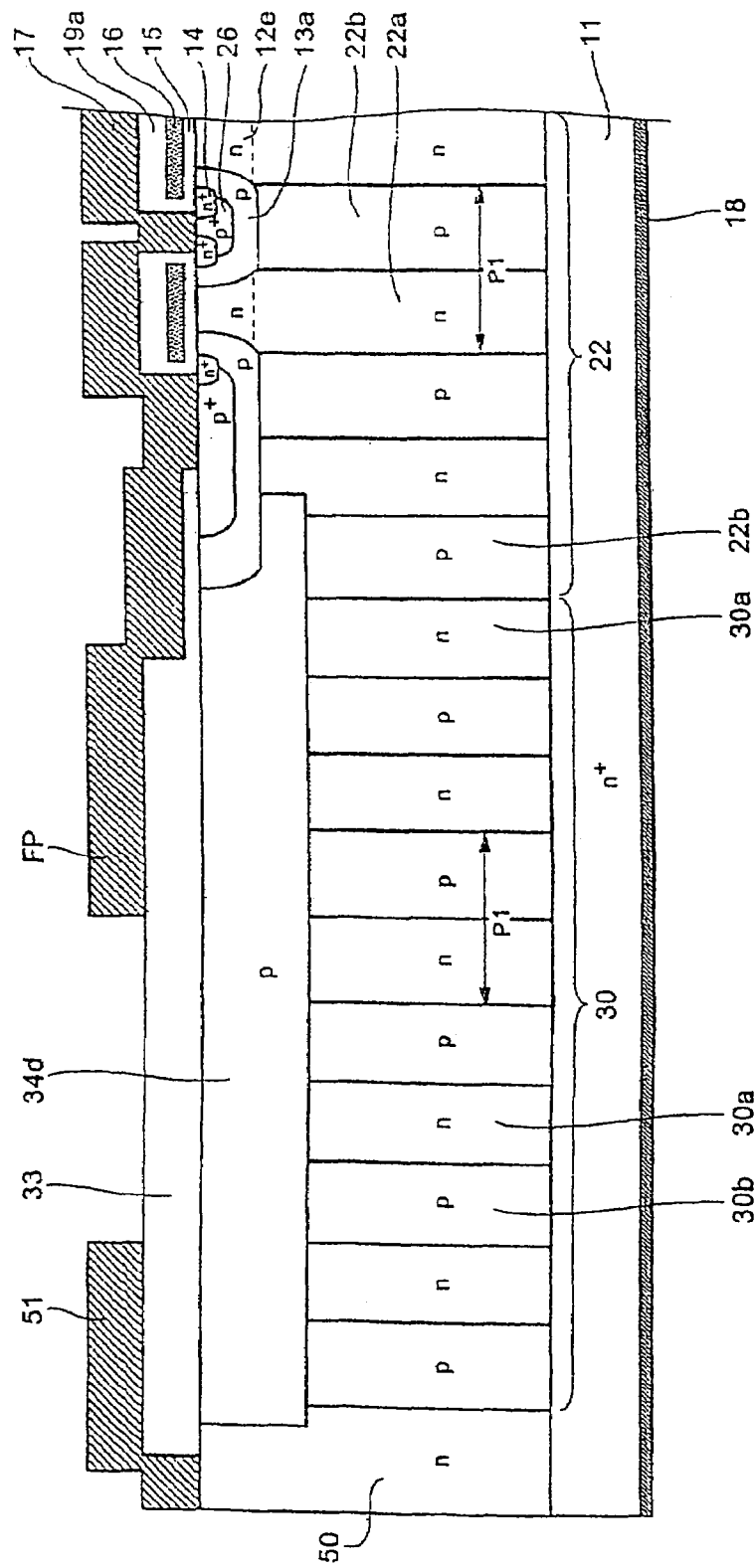
FIG. 13 is a cross sectional view along the line segment XIII-XIII of FIG. 12.

Referring to FIGS. 12 and 13, in the fourth embodiment, a lightly doped p-type region 34d is arranged in substitution for the third alternating conductivity type layer in the upper surface portion in peripheral section 30 of the semiconductor chip. A part of the lightly doped p-type region 34d is covered with the field plate electrode FP connected to its p-type base region 13a with an oxide film 33 interposed between the lightly doped p-type region 34d and the field plate electrode FP, similar to the first embodiment.

The fourth embodiment relaxes the surface electric field with the lightly doped p-type region 34d. If the impurity concentration in the p-type region 34d is so high that the p-type region 34d is not depleted when a voltage is applied between the drain and the source, and between the drain and the gate, the breakdown voltage will be lowered. Therefore, it is preferable for the impurity concentration in the p-type region 34d to be lower than the impurity concentration in the second p-type regions 30b. For example, the impurity concentration in the p-type region 34d can be $4.8 \times 10^{14}$ cm$^{-3}$. The other sizes and impurity concentrations can be the same as those for the first embodiment. The p-type region 34d, which has high resistance, is doped with an n-type impurity and a p-type impurity. Since the n-type impurity and the p-type impurity compensate each other, the region doped with almost the same amounts of n-type and p-type impurities works as a high resistive region. Therefore, by doping a p-type impurity more than an n-type impurity, a high resistive p-type region is formed easily. Since the impurity concentrations in the high resistive p-type region are controlled easily by adjusting the amounts of the respective impurities or the width of the region to be doped with the respective impurities, the high resistive p-type region can be manufactured with excellent mass-productivity.

The present inventors have conducted simulations on the current vs. voltage characteristics of the peripheral and active sections at the occurrence of avalanche breakdown of a vertical MOSFET of the 600 V class having the structure shown in FIGS. 12 and 13. The results are described in FIGS. 14-16. In the simulations, the impurity concentration in the p-type region 34d is set at $4.8\times10^{14}$ cm$^{-3}$. The other sizes and impurity concentrations in the constituent portions of the alternating conductivity type layers are set at the values described earlier for the MOSFET according to the first embodiment. Considering the impurity concentration variations, the impurity concentration Nn in the n-type regions is set to be lower by 10% than the impurity concentration Np in the p-type regions in FIG. 14, the impurity concentration Nn in the n-type regions is set to be equal to the impurity concentration Np in the p-type regions in FIG. 15, and the impurity concentration Nn in the n-type regions is set to be higher by 10% than the impurity concentration Np in the p-type regions in FIG. 16.

Figure 14:
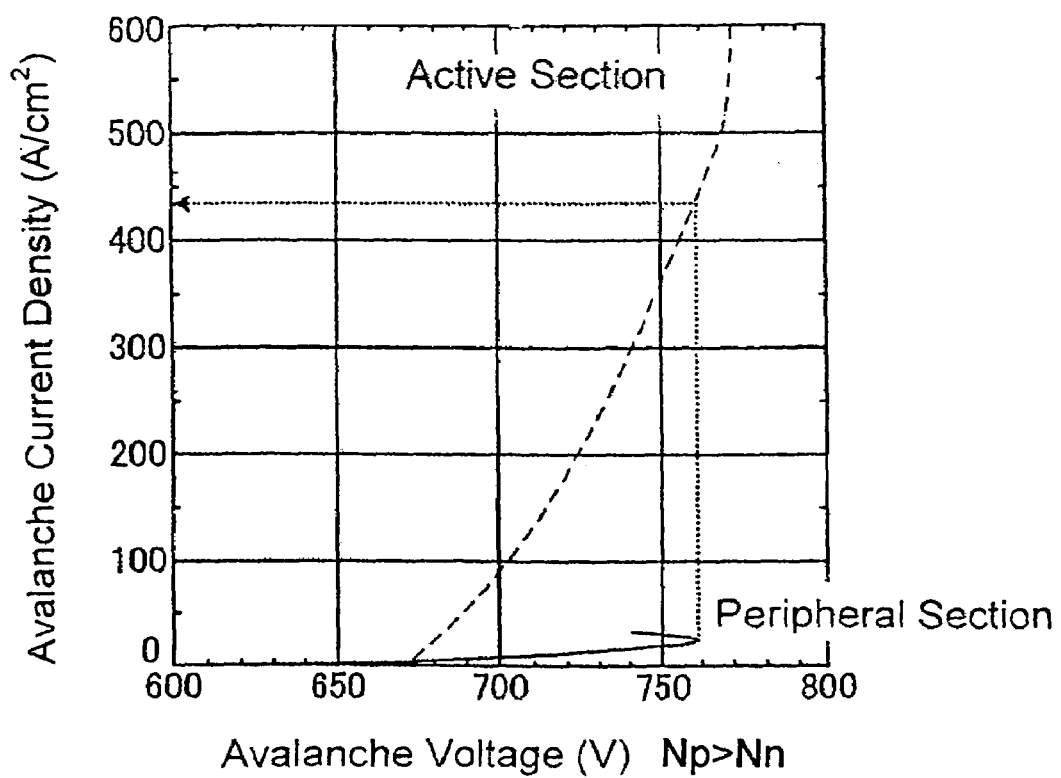
FIG. 14 is a graph describing the simulation results on the avalanche breakdown in the portion along the line segment XIII-XIII of FIG. 12 for the impurity concentration Np in the p-type regions higher than the impurity concentration Nn in the n-type region.
Figure 15:
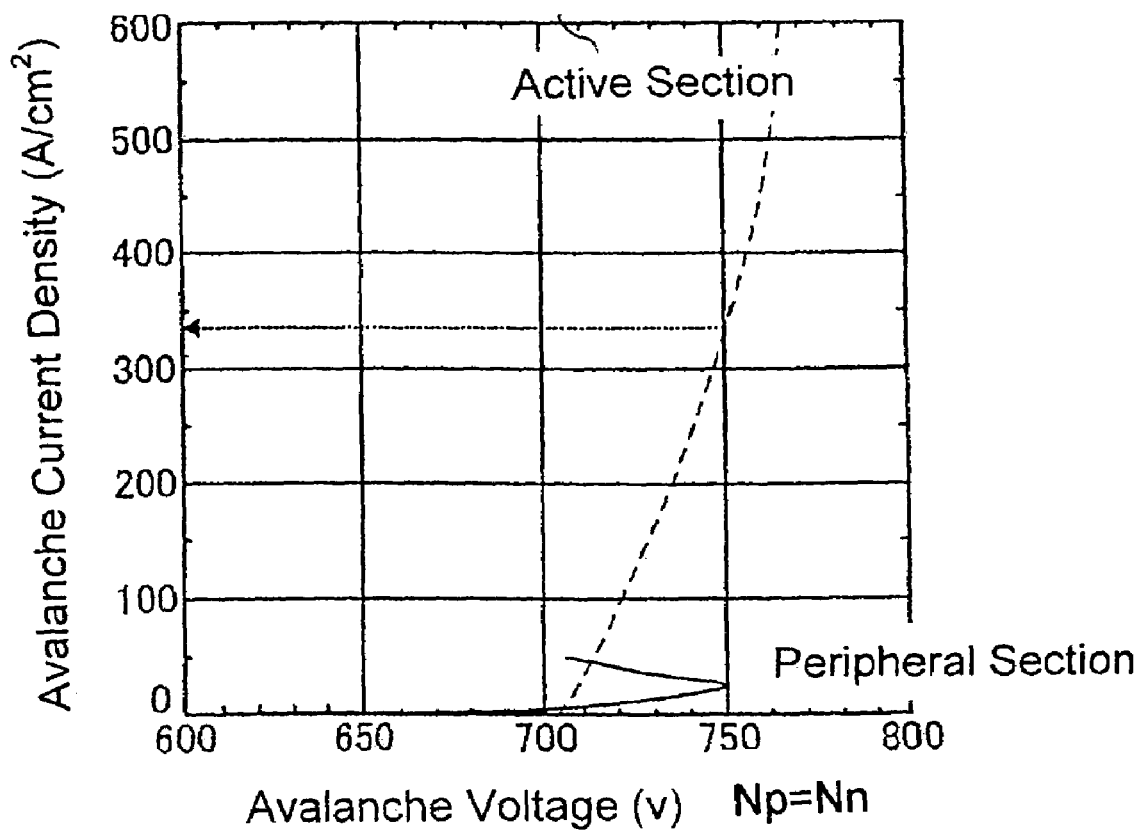
FIG. 15 is a graph describing the simulation results on the avalanche breakdown in the portion along the line segment XIII-XIII of FIG. 12 for the impurity concentration Np in the p-type regions equal to the impurity concentration Nn in the n-type region.
Figure 16:
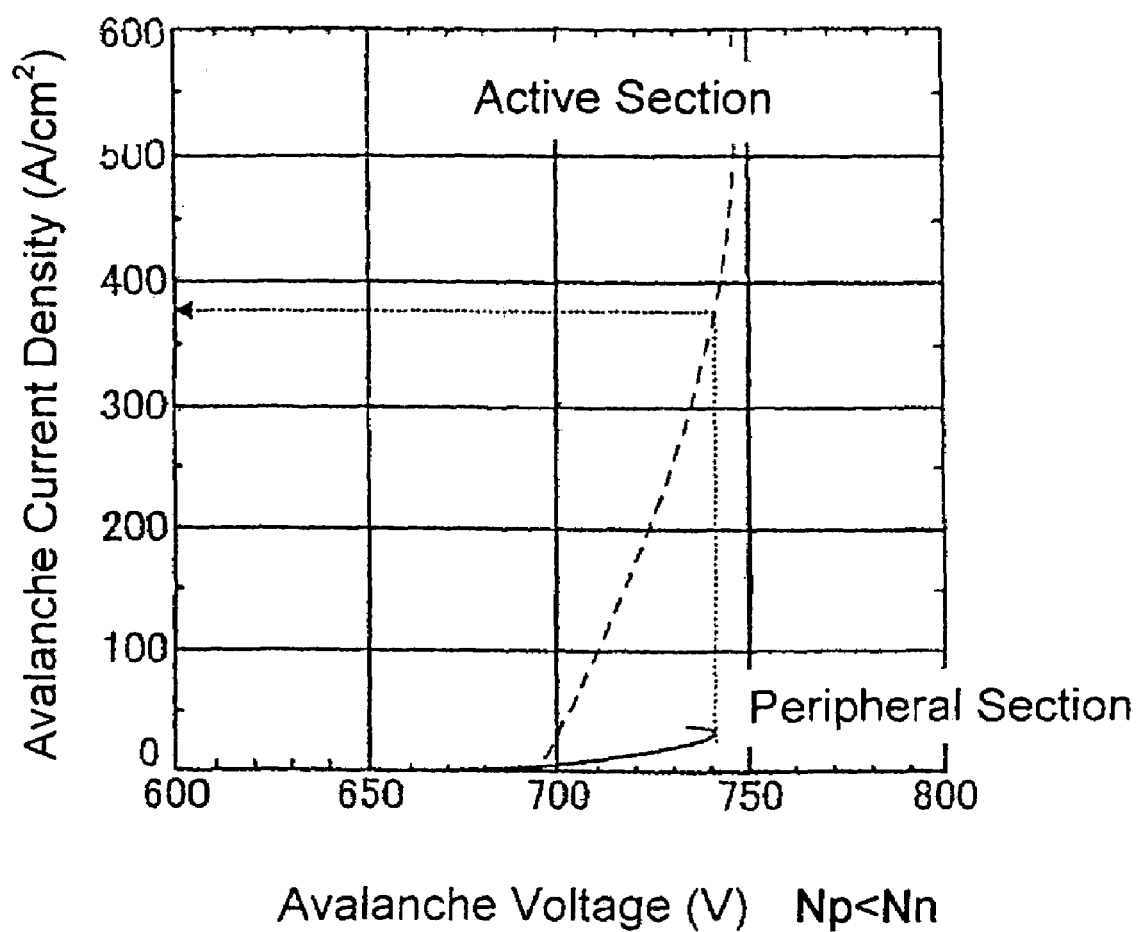
FIG. 16 is a graph describing the simulation results on the avalanche breakdown in the portion along the line segment XIII-XIII of FIG. 12 for the impurity concentration Np in the p-type regions lower than the impurity concentration Nn in the n-type region.

Comparing FIGS. 14-16 with FIGS. 26-28 (for the conventional MOSFET), the avalanche voltage, at which negative resistance is formed in the peripheral section 30, in the MOSFET according to the fourth embodiment is higher in all the cases than the avalanche voltage in the conventional MOSFET. Since the avalanche current that can be made to flow in the active section of the MOSFET according to the fourth embodiment is higher, the MOSFET according to the fourth embodiment improves the avalanche withstanding capability. Even when the impurity concentration in the n-type regions varies by ±10%, the avalanche withstanding capability of 340 A/cm$^2$ or more can be obtained.

Figure 17:
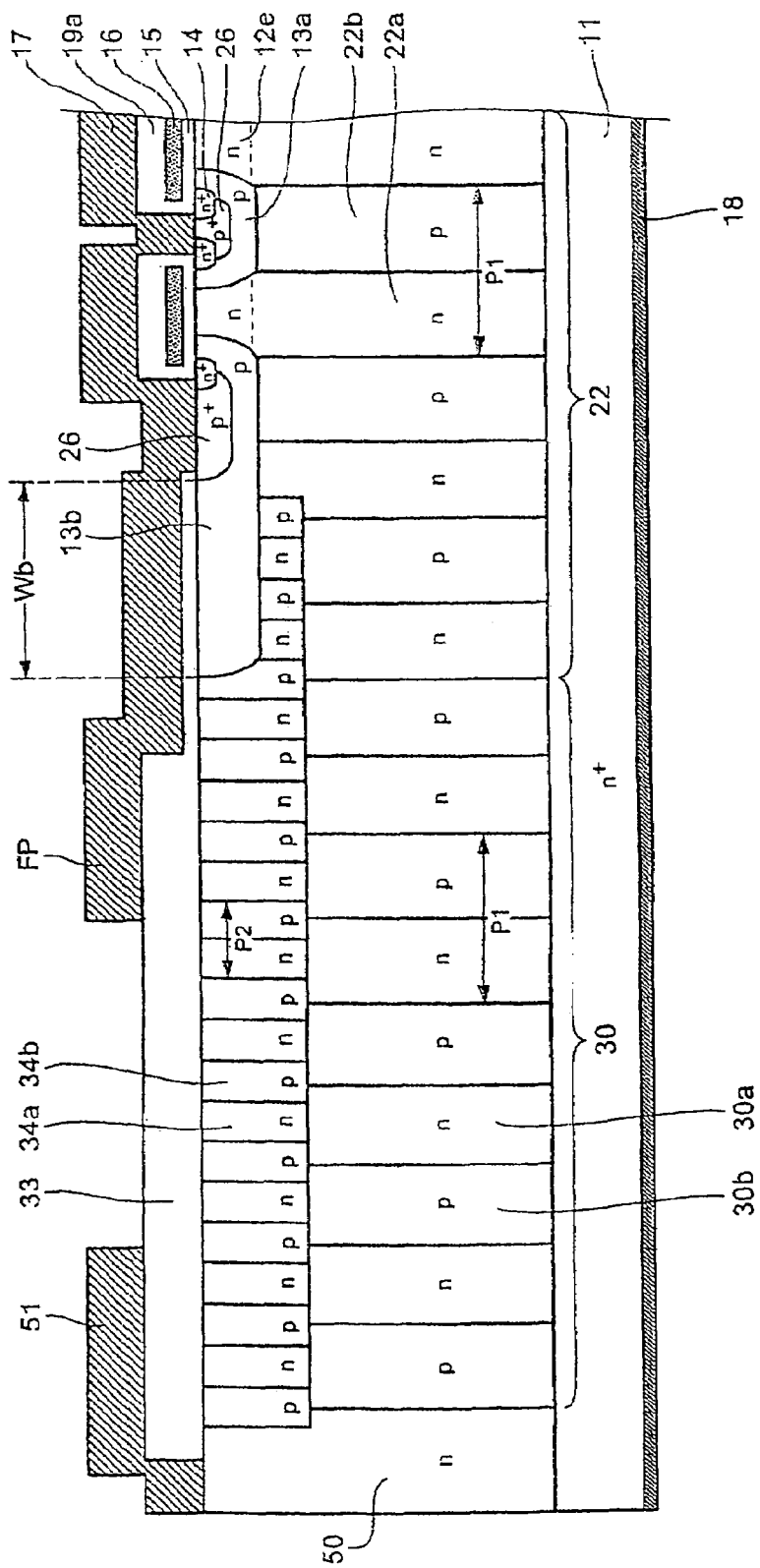
FIG. 17 is a cross sectional view of a fifth embodiment of a vertical MOSFET embodying the present invention.

Referring to FIG. 17, the fifth embodiment is similar to the conventional structure illustrated in FIG. 24, except that the fifth embodiment has a portion of an outermost p-type base region 13b covered with an oxide film 33 in the outer area of its p$^+$-type contact region 26 in contact with its source electrode 17, has a width Wb that is wider than the pitch P1 of the repeating n-type and p-type regions 22a, 22b of the first alternating conductivity type layer 22. In the outermost p-type base region 13b, the p$^+$-type contact region 26 corresponds to a second portion doped relatively heavily and the portion of the outermost p-type base region 13b excluding the p$^+$-type contact region 26 corresponds to a first portion doped relatively lightly.

In the fifth embodiment, its second alternating conductivity type layer formed of second n-type regions 30a and second p-type regions 30b is continuous with the first alternating conductivity type layer, and no transient region, in which the pitch of repeating n-type and p-type regions becomes discontinuous, is formed in the same manner as in the MOSFET according to the first embodiment. Therefore, the fifth embodiment prevents the lowering of the breakdown voltage due to charge imbalance.

In the fifth embodiment, for example, if it exhibits a breakdown voltage of the 600 V class, the sizes and the impurity concentrations of the constituent portions can be as follows, although not limited thereto. The thickness (in the depth direction) of the drain drift section 22 can be 44.0 μm. The first n-type region 22a and the first p-type region 22b each can be 8.0 μm in width so that the pitch P1 can be 16.0 μm. The impurity concentration in each of the first n-type region 22a and the first p-type region 22b can be $2.4\times10^{15}$ cm$^{-3}$. The thickness (in the depth direction) of the second alternating conductivity type layer in the peripheral section 30 can be 31.0 μm. The second n-type region 30a and the second p-type region 30b each can be 8.0 μm in width so that the pitch P1 can be 16.0 μm. The impurity concentration in each of the second n-type region 30a and the second p-type region 30b can be $2.4\times10^{15}$ cm$^{-3}$. The thickness (in the depth direction) of the third alternating conductivity type layer in the peripheral section 30 can be 13.0 μm. The third n-type regions 34a and the third p-type regions 34b each can be 4.0 μm in width so that the pitch P2 can be 8.0 μm. The impurity concentration in each of the third n-type regions 34a and the third p-type regions 34b can be $4.8\times10^{14}$ cm$^{-3}$. The diffusion depth of the p-type base region 13a can be 3.0 μm. The surface impurity concentration in the p-type base region 13a can be $1.0\times10^{17}$ cm$^{-3}$. The diffusion depth of the p$^+$-type contact region 26 can be 1.0 μm. The surface impurity concentration in the p$^+$-type contact region 26 can be $4.0\times10^{19}$ cm$^{-3}$. The diffusion depth of the n$^+$-type source region 14 can be 1.0 μm. The surface impurity concentration in the n$^+$-type source region 14 can be $3.0\times10^{20}$ cm$^{-3}$. The diffusion depth of the sandwiched region 12e can be 2.5 μm. The surface impurity concentration in the sandwiched region 12e can be $2.0\times10^{16}$ cm$^{-3}$. The thickness of the n$^+$-type drain layer 11 can be 300 μm. The impurity concentration in the n$^+$-type drain layer 11 can be $2.0\times10^{18}$ cm$^{-3}$. The width of the n-type channel stopper region 50 can be 30.0 μm. The impurity concentration in the n-type channel stopper region 50 can be $6.0\times10^{15}$ cm$^{-3}$. The diffusion depth of the outermost p-type base region 13b can be 3.0 μm. The width Wb of the portion of the outermost p-type base region 13b covered with the oxide film 33 in the outer area of the p$^+$-type contact region 26 can be 50 μm. The surface impurity concentration in the portion of the outermost p-type base region 13b covered with the oxide film 33 in the outer area of the p$^+$-type contact region 26 can be $1.0\times10^{17}$ cm$^{-3}$.

For improving the avalanche withstanding capability based on the principle of negative resistance during the avalanche breakdown, it is preferable to adopt a structure that facilitates to relax the electric field on the surface side of the semiconductor chip when an avalanche current flows in the peripheral section 30 as described earlier in connection with the first embodiment. Moreover, for improving the avalanche withstanding capability based on the above-described principle, it is also effective to raise the resistance in the outermost p-type base region 13b, through which the avalanche current flows. Therefore, the fifth embodiment lightly dopes the outermost p-type base region 13b and widens the width Wb of the portion of the outermost p-type base region 13b, through which the avalanche current flows, to relax negative resistance.

For preventing formation of negative resistance at the occurrence of avalanche breakdown, it is effective for the resistance value of the entire outermost p-type base region 13b to be 2 Ω or higher. The reason for this is that the negative resistance value of the peripheral section in the conventional MOSFET, in which the impurity concentration Nn in the n-type regions is higher than the impurity concentration Np in the p-type regions, is around 2 Ω. For example, when the total circumference length of outermost p-type region 13b is 16 mm, the sheet resistance thereof 800 Ω/square, and the width Wb thereof 50 μm in the fifth embodiment, the resistance value of the entire outermost p-type base region 13b is around 2.5 Ω. In this case, the current localization is relaxed even when avalanche is locally formed in part of the outermost p-type region 13b.

In the ON-state of the device, the outermost p-type base region 13b is an ineffective region that does not make any current flow. For efficiently utilizing the device area, it is preferable for the outermost p-type base region 13b to be as narrow as possible. However, for preventing negative resistance at the occurrence of avalanche breakdown, it is necessary to widen the outermost p-type base region 13b to some extents. In detail, it is preferable for the width of the outermost p-type base region 13b to be wider than the pitch P1.

Figure 18:
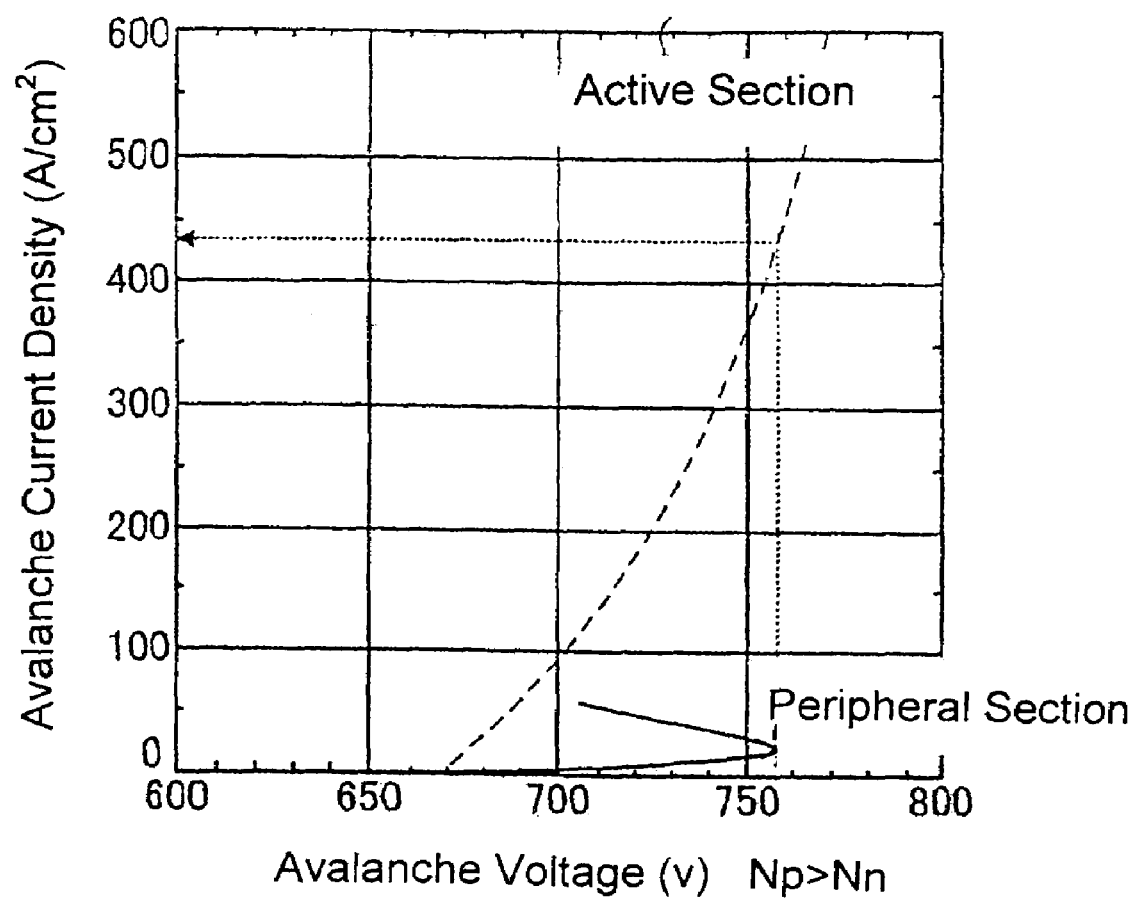
FIG. 18 is a graph describing the simulation results on the avalanche breakdown in the cross section shown in FIG. 17 for the impurity concentration Np in the p-type regions higher than the impurity concentration Nn in the n-type region.
Figure 19:
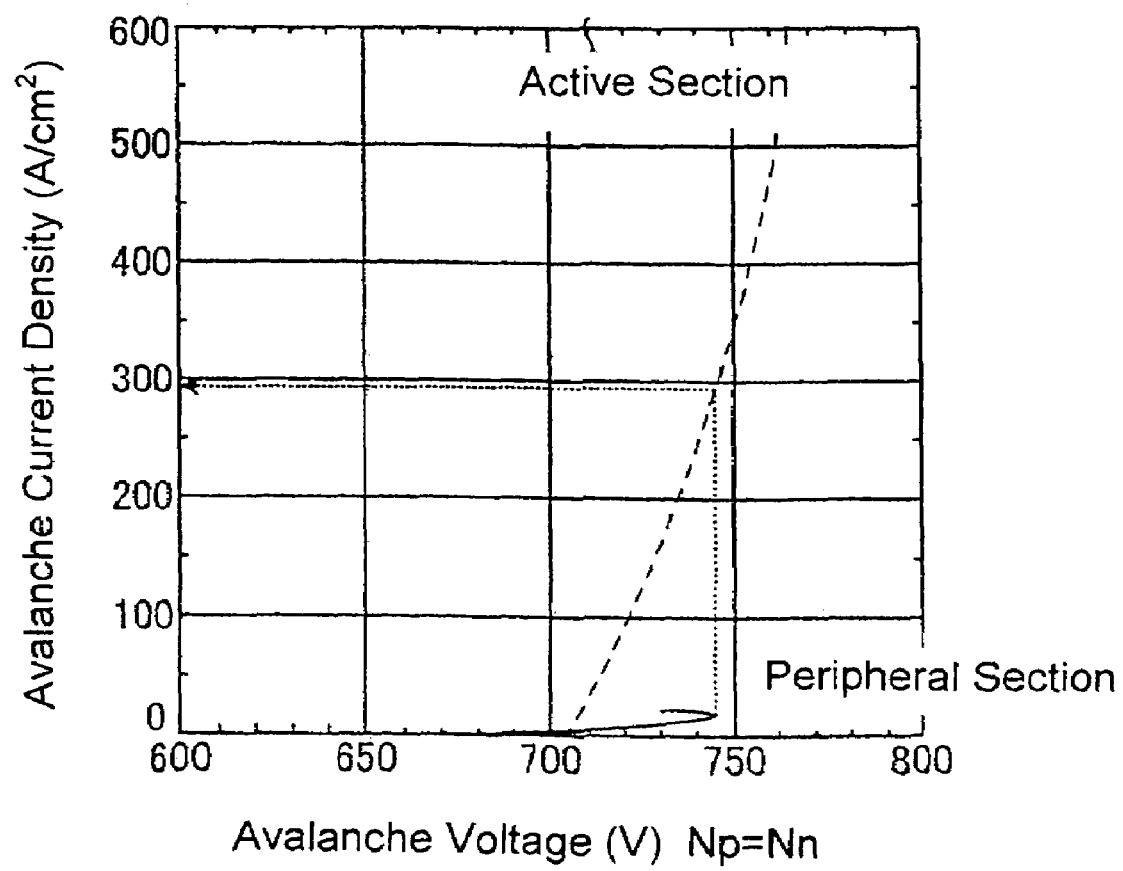
FIG. 19 is a graph describing the simulation results on the avalanche breakdown in the cross section shown in FIG. 17 for the impurity concentration Np in the p-type regions equal to the impurity concentration Nn in the n-type region.

The present inventors have conducted simulations on the current vs. voltage characteristics of the peripheral and active sections in the avalanche breakdown of a vertical MOSFET of the 600 V class having the fifth embodiment. The results are described in FIGS. 18-20. The sizes and the impurity concentrations in the constituent portions of the alternating conductivity type layers are set at the same values described above. Considering the impurity concentration variations, the impurity concentration Nn in the n-type regions is set to be lower by 10% than the impurity concentration Np in the p-type regions in FIG. 18, the impurity concentration Nn in the n-type regions is set to be equal to the impurity concentration Np in the p-type regions in FIG. 19, and the impurity concentration Nn in the n-type regions is set to be higher by 10% than the impurity concentration Np in the p-type regions in FIG. 20.

Figure 20:
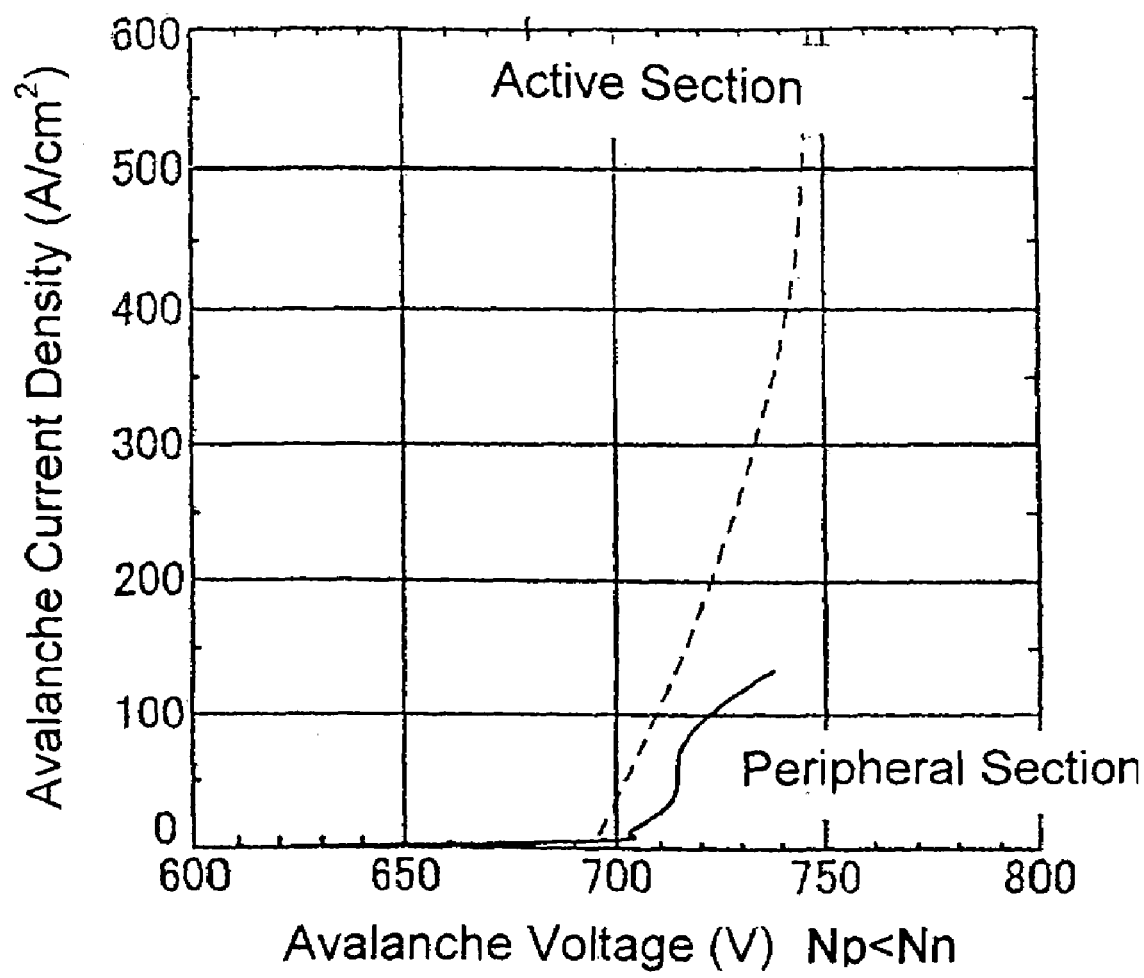
FIG. 20 is a graph describing the simulation results on the avalanche breakdown in the cross section shown in FIG. 17 for the impurity concentration Np in the p-type regions lower than the impurity concentration Nn in the n-type region.

As the comparison of FIG. 20 with FIG. 28 (for the conventional MOSFET) clearly indicates, the avalanche withstanding capability is improved by the MOSFET according to the fifth embodiment, since negative resistance is relaxed and the positive resistance is realized when the impurity concentration Np in the p-type regions is lower than the impurity concentration Nn in the n-type regions. In contrast, as the comparison of FIG. 18 with FIG. 26 (for the conventional MOSFET) and the comparison of FIG. 19 with FIG. 27 (for the conventional MOSFET) clearly indicate, the negative resistance is not quite relaxed when the impurity concentration Np in the p-type regions is equal to or higher than the impurity concentration Nn in the n-type regions. This is because the avalanche current flows only halfway through the outermost p-type base region 13b or only through part of the outermost p-type base region 13b.

Since the avalanche voltage, at which negative resistance is formed in the peripheral section 30 of the MOSFET according to the fifth embodiment, is high in any case, the MOSFET according to the fifth embodiment facilitates a high avalanche withstanding capability. As FIGS. 18-20 indicate, the avalanche withstanding capability of around 300 A/cm$^2$ or more is obtained, even when the impurity concentrations in the n-type regions vary by ±10%.

JP P2003-224273A mentioned earlier shows (e.g. FIG. 14 thereof) shows a structure, in which the portion of an outermost p-type base region between the peripheral section of the device and a heavily doped p-type region formed in the outermost p-type base region is a little bit wider than the heavily doped p-type region. However, this reference does not consider the formation of negative resistance at the occurrence of avalanche breakdown. As FIG. 14 of this reference indicates, the portion of the outermost p-type base region covered with an oxide film between the peripheral section and the heavily doped p-type region formed in the outermost p-type base region is not especially wide. Since the corresponding portion of the outermost p-type base region in the MOSFET according to the fifth embodiment of the invention is much wider than that shown in FIG. 14 of this reference, the MOSFET according to the fifth embodiment of the invention is different from that of this reference.

Figure 21:
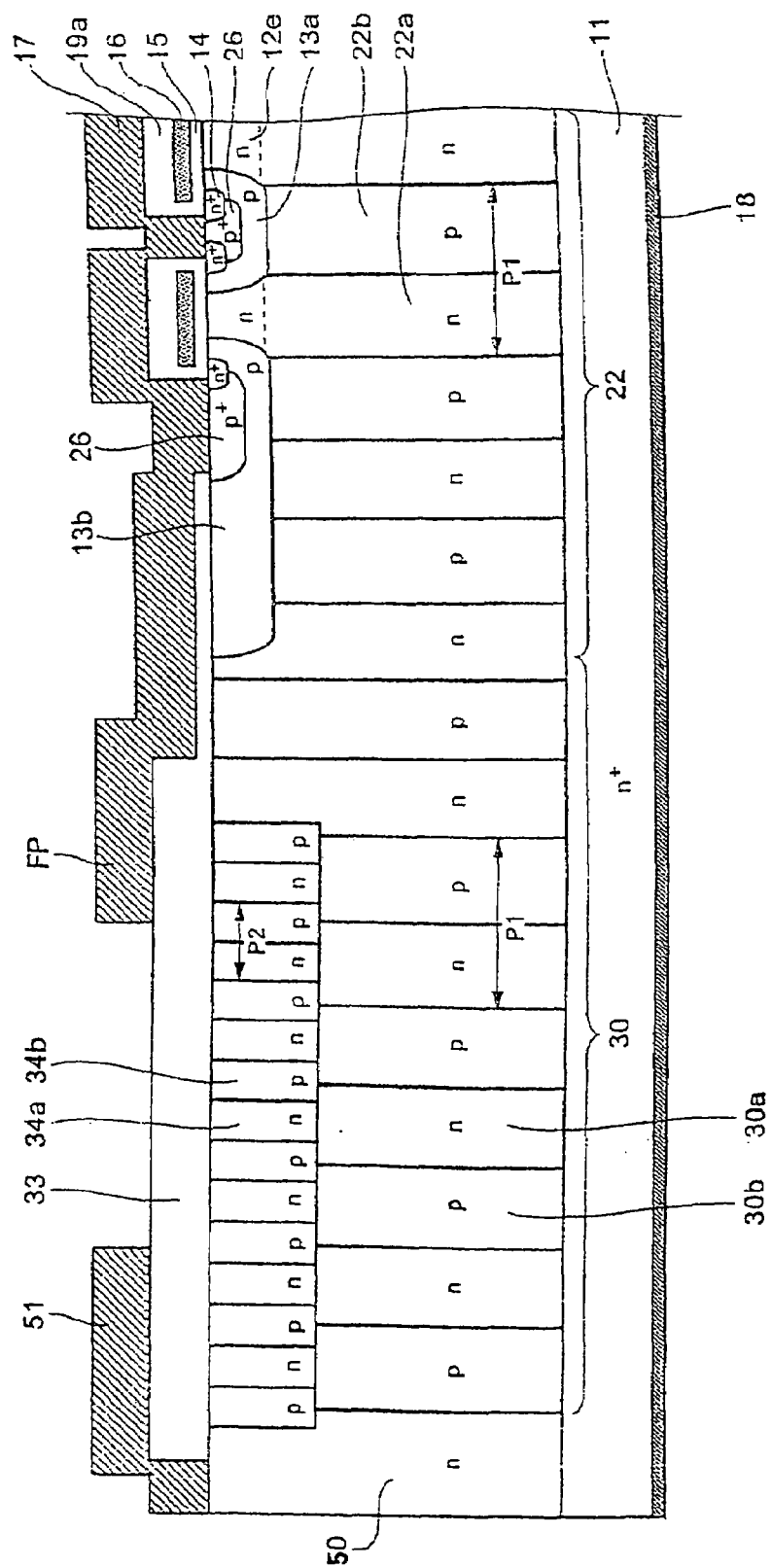
FIG. 21 is a cross sectional view of a sixth embodiment of a vertical MOSFET embodying the present invention.

Referring to FIG. 21, the sixth embodiment is a modification of the fifth embodiment. In the sixth embodiment, its third alternating conductivity type layer formed of the third n-type regions 34a and the third p-type regions 34b is not connected to the outermost p-type base region 13b. When the impurity concentration Np in the p-type regions is lower than the impurity concentration Nn in the n-type regions in this structure, the avalanche current caused by the avalanche in the corner portion of the outermost p-type base region 13b flows to its source electrode 17 through the wide portion of the outermost p-type base region 13b in the outer area of the p$^+$-type contact region 26. Therefore, negative resistance formed at the occurrence of avalanche breakdown is relaxed. Therefore, the MOSFET according to the sixth embodiment exhibits the same effects as the MOSFET according to the fifth embodiment.

Figure 22:
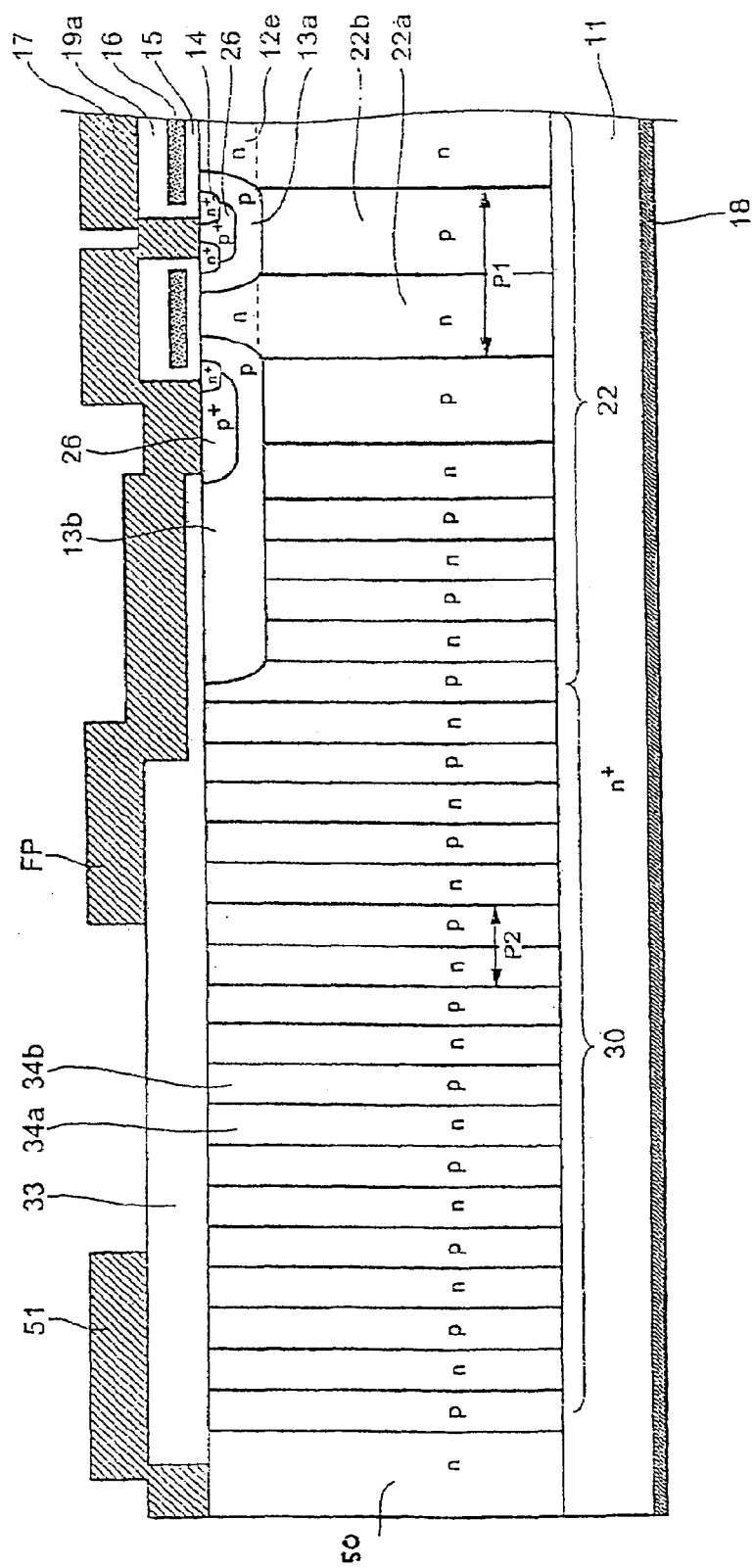
FIG. 22 is a cross sectional view of a seventh embodiment of a vertical MOSFET embodying the present invention.

Referring to FIG. 22, the seventh embodiment is a modification of the fifth embodiment. In the seventh embodiment, the third alternating conductivity type layer formed of the third n-type regions 34a and the third p-type regions 34b reaches the n$^+$-type drain layer 11. In other words, the second alternating conductivity type layer formed of the second n-type regions 30a and the second p-type regions 30b is omitted in the seventh embodiment. Negative resistance, formed at the occurrence of avalanche breakdown when the impurity concentration Np in the p-type regions is lower than the impurity concentration Nn in the n-type regions in this structure, is also relaxed. Therefore, the MOSFET according to the seventh embodiment exhibits the same effects as the MOSFET according to the fifth embodiment.

Although the invention has been described in connection with the illustrated embodiments, changes and modification that are obvious to those skilled in the art without departing from the true spirits of the invention can be implemented. For example, a guard ring structure is employable for the surface edge structure in substitution for the field plate structure. When the surface edge structure facilitates relaxing the curvature of the p-type base region 13b positioned in the outermost portion of the active section, a field plate structure, a guard ring structure and a combination of the field plate structure and the guard ring structure can be employed. The active section formed on the first major surface side of the semiconductor chip is a switching section including a channel diffusion layer for forming an inversion layer on the first major surface side and a source region in the vertical MOSFET and a switching section including an emitter region or a collector region in the bipolar transistor. That is, the active section is a section that exhibits a function of selecting conduction and non-conduction actively or passively on the first major surface side of the drift section. Therefore, the invention is applicable not only to MOSFETs but also to IGBTs, bipolar transistors, FWDs, and Schottky diodes.

The present superjunction semiconductor device has an alternating conductivity type structure in the peripheral section, around the drift section that also has an alternating conductivity type structure. The superjunction semiconductor device having such alternating conductivity type structures can greatly reduce the tradeoff relation between the on-resistance and the breakdown voltage. The present superjunction semiconductor device can improve the avalanche withstanding capability in the peripheral section of the device, to further improve the avalanche withstanding capability of the entire device. The present superjunction semiconductor device can also relax the negative resistance formed during the avalanche breakdown to further improve the avalanche withstanding capability of the entire device. The present semiconductor device thus can provide a high breakdown voltage and a high current density simultaneously.

As described above, the semiconductor devices according to the present invention can be applied for high power use.

The semiconductor devices according to the present invention is also suitable especially for the MOSFETs, IGBTs, bipolar transistors, and such semiconductor devices, having an alternating conductivity type structure in the drift section thereof, which facilitate a high breakdown voltage and a high current capacity simultaneously.

Given the disclosure of the present invention, one versed in the art would appreciate that there may be other embodiments and modifications within the scope and spirit of the present invention. Accordingly, all modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, Japanese Application Nos. 2004-228599 and 2005-006869, and the disclosures of the priority applications, in their entirety, including the drawings, claims, and the specifications thereof, are incorporated herein by reference.

What is claimed is:

1. A semiconductor device comprising:
   a semiconductor chip having a first major surface and a second major surface facing opposite to each other;
   an active section on the side of the first major surface for flowing current actively or passively;
   a low resistance layer of a first conductivity type on the side of the second major surface, the low resistance layer exhibiting low electrical resistance;
   a vertical drift section between the active section and the low resistance layer, the vertical drift section providing a substantially vertical drift current path in the ON-state of the semiconductor device, the vertical drift section being substantially depleted in the OFF-state of the semiconductor device; and
   a peripheral section formed between the first major surface and the low resistance layer, and formed around the vertical drift section, the peripheral section providing substantially no current path in the ON-state of the semiconductor device and being substantially depleted in the OFF-state of the semiconductor device,
   wherein the vertical drift section comprises a first alternating conductivity type layer comprised of first regions of the first conductivity type and first regions of a second conductivity type arranged alternately at a first pitch repeating along the first major surface,
   wherein the peripheral section comprises a first subsection and a second subsection, the second subsection being in the surface portion of the peripheral section between the first major surface and the first subsection,
   wherein the first subsection comprises a second alternating conductivity type layer comprised of second regions of the first conductivity type and second regions of the second conductivity type arranged alternately at the first pitch also repeating along the first major surface,
   wherein the second subsection comprises a third alternating conductivity type layer composed of third regions of the first conductivity type and third regions of the second conductivity type arranged alternately at a second pitch also repeating along the first major surface,
   wherein the second pitch is narrower than the first pitch, and
   wherein the impurity or carrier concentration or the carrier amount in the third regions of the second conductivity type is higher than the respective impurity or carrier concentration or the carrier amount in the third regions of the first conductivity type.

2. The semiconductor device according to claim 1, wherein the impurity or carrier concentration or the carrier amount in the third regions of the second conductivity type is at least 1.2 times higher than the respective impurity or carrier concentration or the carrier amount in the third regions of the first conductivity type.

3. The semiconductor device according to claim 2, wherein the impurity concentrations in the second subsection are lower than the impurity concentrations in the first subsection.

4. The semiconductor device according to claim 1, wherein the active section further includes a region of the second conductivity type, and part of the second subsection is arranged below an end portion of the region of the second conductivity type of the active section.

5. The semiconductor device according to claim 1, wherein the thickness of the second subsection is 0.5 times or less as thick as the total thickness of the first subsection and the second subsection.

6. The semiconductor device according to claim 1, further comprising a channel stopper region of the first conductivity type around the first subsection and the second subsection.

7. The semiconductor device according to claim 6, wherein the channel stopper region is connected to the low resistance layer.

8. The semiconductor device according to claim 1, wherein the second subsection is covered with an insulator film.

9. The semiconductor device according to claim 8, further comprising a field plate electrode covering part of the second subsection with the insulator film interposed therebetween.

10. A semiconductor device comprising:
    a semiconductor chip having a first major surface and a second major surface facing opposite to each other;
    an active section on the side of the first major surface for flowing current actively or passively;
    a low resistance layer of a first conductivity type on the side of the second major surface, the low resistance layer exhibiting low electrical resistance;
    a vertical drift section between the active section and the low resistance layer, the vertical drift section providing a substantially vertical drift current path in the ON-state of the semiconductor device, the vertical drift section being substantially depleted in the OFF-state of the semiconductor device; and
    a peripheral section formed between the first major surface and the low resistance layer, and formed around the vertical drift section, the peripheral section providing substantially no current path in the ON-state of the semiconductor device and being substantially depleted in the OFF-state of the semiconductor device,
    wherein the vertical drift section comprises a first alternating conductivity type layer comprised of first regions of the first conductivity type and first regions of a second conductivity type arranged alternately at a first pitch repeating along the first major surface,
    wherein the peripheral section comprises a first subsection and a second subsection, the second subsection being in the surface portion of the peripheral section between the first major surface and the first subsection,
    wherein the first subsection comprises a second alternating conductivity type layer comprised of second regions of the first conductivity type and second regions of the second conductivity type arranged alternately at the first pitch also repeating along the first major surface, wherein the second subsection comprises a third alternating conductivity type layer composed of third regions of the first conductivity type and third regions of the second conductivity type arranged alternately at a second pitch also repeating along the first major surface, wherein the second pitch is narrower than the first pitch, and wherein the width of the third regions of the second conductivity type is wider than the width of the third regions of the first conductivity type.

11. The semiconductor device according to claim 10, wherein the width of the third regions of the second conductivity type is at least 1.2 times wider than the width of the third regions of the first conductivity type.

12. The semiconductor device according to claim 11, wherein the impurity concentrations in the second subsection are lower than the impurity concentrations in the first subsection.

13. The semiconductor device according to claim 10, wherein the active section further includes a region of the second conductivity type, and part of the second subsection is arranged below an end portion of the region of the second conductivity type of the active section.

14. The semiconductor device according to claim 10, wherein the thickness of the second subsection is 0.5 times or less as thick as the total thickness of the first subsection and the second subsection.

15. The semiconductor device according to claim 10, further comprising a channel stopper region of the first conductivity type around the first subsection and the second subsection.

16. The semiconductor device according to claim 15, wherein the channel stopper region is connected to the low resistance layer.

17. The semiconductor device according to claim 10, wherein the second subsection is covered with an insulator film.

18. The semiconductor device according to claim 17, further comprising a field plate electrode covering part of the second subsection with the insulator film interposed therebetween.

19. A semiconductor device comprising:
a semiconductor chip having a first major surface and a second major surface facing opposite to each other;
an active section on the side of the first major surface for flowing current actively or passively;
a low resistance layer of a first conductivity type on the side of the second major surface, the low resistance layer exhibiting low electrical resistance;
a vertical drift section between the active section and the low resistance layer, the vertical drift section providing a substantially vertical drift current path in the ON-state of the semiconductor device, the vertical drift section being substantially depleted in the OFF-state of the semiconductor device; and
a peripheral section formed between the first major surface and the low resistance layer, and formed around the vertical drift section, the peripheral section providing substantially no current path in the ON-state of the semiconductor device and being substantially depleted in the OFF-state of the semiconductor device,
wherein the vertical drift section comprises a first alternating conductivity type layer comprised of first regions of the first conductivity type and first regions of a second conductivity type arranged alternately at a first pitch repeating along the first major surface, wherein the peripheral section comprises a first subsection and a second subsection, the second subsection being in the surface portion of the peripheral section between the first major surface and the first subsection, wherein the first subsection comprises a second alternating conductivity type layer comprised of second regions of the first conductivity type and second regions of the second conductivity type arranged alternately at the first pitch also repeating along the first major surface, and wherein the second subsection comprises a region of the second conductivity type having a width wider than the first pitch.

20. The semiconductor device according to claim 19, wherein the second subsection is doped more lightly than the second regions of the second conductivity.

21. The semiconductor device according to claim 20, wherein the second subsection comprises an impurity of the first conductivity type and an impurity of the second conductivity type.

22. The semiconductor device according to claim 19, wherein the active section further includes a region of the second conductivity type, and part of the second subsection is arranged below an end portion of the region of the second conductivity type of the active section.

23. The semiconductor device according to claim 19, wherein the thickness of the second subsection is 0.5 times or less as thick as the total thickness of the first subsection and the second subsection.

24. The semiconductor device according to claim 19, further comprising a channel stopper region of the first conductivity type around the first subsection and the second subsection.

25. The semiconductor device according to claim 24, wherein the channel stopper region is connected to the low resistance layer.

26. The semiconductor device according to claim 19, wherein the second subsection is covered with an insulator film.

27. The semiconductor device according to claim 26, further comprising a field plate electrode covering part of the second subsection with the insulator film interposed therebetween.

28. A semiconductor device comprising:
a semiconductor chip having a first major surface and a second major surface facing opposite to each other;
an active section on the side of the first major surface for flowing current actively or passively;
a low resistance layer of a first conductivity type on the side of the second major surface, the low resistance layer exhibiting low electrical resistance;
a vertical drift section between the active section and the low resistance layer, the vertical drift section providing a substantially vertical drift current path in the ON-state of the semiconductor device, the vertical drift section being substantially depleted in the OFF-state of the semiconductor device; and
base regions of a second conductivity type on the side of the first major surface,
wherein the vertical drift section comprises a first alternating conductivity type layer composed of first regions of the first conductivity type and first regions of the second conductivity type arranged alternately at a first pitch repeating along the first major surface, wherein an outermost one of the base regions includes a first portion doped relatively lightly and a second portion doped relatively heavily, wherein the first portion is covered partly with an insulator film in the outer area of the second portion, and wherein the width of the first portion partly covered with the insulator film is wider than the first pitch.

29. The semiconductor device according to claim 28, wherein the resistance value of the first portion partly covered with the insulator film in the outer area of the second portion is 2Ω or higher.

30. The semiconductor device according to claim 28, further comprising:

a peripheral section formed between the first major surface and the low resistance layer, and formed around the vertical drift section, the peripheral section providing substantially no current path in the ON-state of the semiconductor device and being substantially depleted in the OFF-state of the semiconductor device, wherein the peripheral section comprising an alternating conductivity type layer comprised of regions of the first conductivity type and regions of the second conductivity type arranged alternately along the first major surface, wherein the regions of the first conductivity type and the regions of the second conductivity type arranged alternately in the peripheral section repeat at a second pitch along at least in a portion of the alternating conductivity type layer of the peripheral section on the side of the first major surface, and wherein the second pitch is narrower than the first pitch.

31. The semiconductor device according to claim 30, wherein part of the portion of the alternating conductivity type layer of the peripheral section repeating at the second pitch is arranged below the outermost one of the base regions.

32. The semiconductor device according to claim 31, further comprising:

a second alternating conductivity type layer between the portion of the alternating conductivity type layer of the peripheral section repeating at the second pitch and the low resistance layer, wherein the second alternating conductivity type layer comprises second regions of the first conductivity type and second regions of the second conductivity type arranged alternately at the first pitch repeating along the first major surface.

* * * * *